US010818997B2

(12) United States Patent
Pettus et al.

(10) Patent No.: US 10,818,997 B2
(45) Date of Patent: Oct. 27, 2020

(54) WAVEGUIDE INTERFACE AND PRINTED CIRCUIT BOARD LAUNCH TRANSDUCER ASSEMBLY AND METHODS OF USE THEREOF

(71) Applicant: Vubiq Networks, Inc., Irvine, CA (US)

(72) Inventors: Michael Gregory Pettus, Laguna Niguel, CA (US); Robert Lee Eisenhart, Woodland Hills, CA (US)

(73) Assignee: VUBIQ NETWORKS, INC., Irvine, CA (US)

( * ) Notice: Subject to any disclaimer, the term of this patent is extended or adjusted under 35 U.S.C. 154(b) by 248 days.

(21) Appl. No.: 15/858,839

(22) Filed: Dec. 29, 2017

(65) Prior Publication Data

US 2019/0207283 A1 Jul. 4, 2019

(51) Int. Cl.
*H01P 5/107* (2006.01)
*H01P 1/04* (2006.01)
*H01P 3/12* (2006.01)
*H05K 1/02* (2006.01)
*H01P 5/10* (2006.01)

(52) U.S. Cl.
CPC .............. *H01P 5/107* (2013.01); *H01P 1/042* (2013.01); *H01P 3/121* (2013.01); *H01P 5/10* (2013.01); *H05K 1/0298* (2013.01)

(58) Field of Classification Search
CPC .......... H01P 3/121; H01P 5/107; H01P 1/042; H01P 5/10; H05K 1/0298; H05K 1/0237
USPC .......................................................... 333/26
See application file for complete search history.

(56) References Cited

U.S. PATENT DOCUMENTS

| 3,265,995 A | 8/1966 | Hamasaki |
| 4,458,222 A | 7/1984 | Herstein et al. |
| 4,684,952 A | 8/1987 | Munson et al. |
| 4,752,680 A | 6/1988 | Larsson |
| 4,754,239 A | 6/1988 | Sedivec |
| 4,939,726 A | 7/1990 | Flammer et al. |

(Continued)

FOREIGN PATENT DOCUMENTS

| DE | 4127892 A1 | 2/1993 |
| DE | 19725492 C1 | 8/1998 |

(Continued)

OTHER PUBLICATIONS

Office Action for Korean Application No. 10-2012-7006846, dated Nov. 5, 2016, pp. 1-9.

(Continued)

*Primary Examiner* — Rakesh B Patel
*Assistant Examiner* — Jorge L Salazar, Jr.
(74) *Attorney, Agent, or Firm* — Troutman Pepper Hamilton Sanders LLP (Rochester)

(57) ABSTRACT

A printed circuit board assembly comprising a plurality of layers. At least one of the plurality of layers is formed of a dielectric material and has an extended portion extending beyond the other layers in the plurality of layers. A first metallic layer is located on at least a portion of the extended portion of the dielectric layer. The first metallic layer and the dielectric layer are configured to form a launch transducer comprising one or more transmission lines and a transducer element coupled to the one or more transmission lines. The transducer element is configured to propagate millimeter wave frequency signals.

21 Claims, 38 Drawing Sheets

(56) References Cited

U.S. PATENT DOCUMENTS

| | | |
|---|---|---|
| 5,007,052 A | 4/1991 | Flammer |
| 5,079,768 A | 1/1992 | Flammer |
| 5,103,210 A | 4/1992 | Rode et al. |
| 5,115,433 A | 5/1992 | Baran et al. |
| 5,130,987 A | 7/1992 | Flammer |
| 5,198,786 A | 3/1993 | Russell et al. |
| 5,218,189 A | 6/1993 | Hutchison |
| 5,235,300 A | 8/1993 | Chan et al. |
| 5,276,345 A | 1/1994 | Siegel et al. |
| 5,347,287 A | 9/1994 | Speciale |
| 5,444,223 A | 8/1995 | Blama |
| 5,465,398 A | 11/1995 | Flammer |
| 5,479,400 A | 12/1995 | Dilworth et al. |
| 5,486,830 A | 1/1996 | Axline, Jr. et al. |
| 5,488,608 A | 1/1996 | Flammer, III |
| 5,515,369 A | 5/1996 | Flammer, III et al. |
| 5,570,084 A | 10/1996 | Ritter et al. |
| 5,726,630 A | 3/1998 | Marsh et al. |
| 5,754,948 A | 5/1998 | Metze |
| 5,767,802 A | 6/1998 | Kosowsky et al. |
| 5,784,543 A | 7/1998 | Marchand |
| 5,864,061 A | 1/1999 | Dilz, Jr. |
| 5,903,239 A | 5/1999 | Takahashi et al. |
| 5,903,566 A | 5/1999 | Flammer, III |
| 5,960,029 A | 9/1999 | Kim et al. |
| 6,027,027 A | 2/2000 | Smithgall |
| 6,028,560 A | 2/2000 | Pfizenmaier et al. |
| 6,037,894 A | 3/2000 | Pfizenmaier et al. |
| 6,104,333 A | 8/2000 | Wood, Jr. |
| 6,236,366 B1 | 5/2001 | Yamamoto et al. |
| 6,236,761 B1 | 5/2001 | Marchand |
| 6,366,245 B1 | 4/2002 | Schmidt et al. |
| 6,424,315 B1 | 7/2002 | Glenn et al. |
| 6,427,922 B1 | 8/2002 | Marchand |
| 6,476,756 B2 | 11/2002 | Landt |
| 6,509,836 B1 | 1/2003 | Ingram |
| 6,542,083 B1 | 4/2003 | Richley et al. |
| 6,545,646 B2 | 4/2003 | Marchand |
| 6,547,140 B2 | 4/2003 | Marchand |
| 6,600,428 B1 | 7/2003 | O'Toole et al. |
| 6,696,879 B1 | 2/2004 | O'Toole et al. |
| 6,708,881 B2 | 3/2004 | Hartmann |
| 6,721,289 B1 | 4/2004 | O'Toole et al. |
| 6,735,183 B2 | 5/2004 | O'Toole et al. |
| 6,771,981 B1 | 8/2004 | Zalewski et al. |
| 6,820,897 B2 | 11/2004 | Breed et al. |
| 6,836,472 B2 | 12/2004 | O'Toole et al. |
| 6,867,983 B2 | 3/2005 | Liu et al. |
| 6,874,639 B2 | 4/2005 | Lawandy |
| 6,891,391 B2 | 5/2005 | Hiroki |
| 6,972,714 B1 | 12/2005 | Baharav et al. |
| 6,987,429 B2 | 1/2006 | Shih et al. |
| 7,289,065 B2 | 10/2007 | Prieto-Burgos et al. |
| 7,295,161 B2 | 11/2007 | Gaucher et al. |
| RE40,253 E | 4/2008 | Kim et al. |
| 7,372,408 B2 | 5/2008 | Gaucher et al. |
| 7,373,107 B1 | 5/2008 | Wesolowski |
| RE40,385 E | 6/2008 | Bang et al. |
| 7,443,906 B1 | 10/2008 | Bang et al. |
| RE41,531 E | 8/2010 | Wood, Jr. |
| 9,088,058 B2 | 7/2015 | Pettus et al. |
| 2002/0140557 A1 | 10/2002 | Dukler et al. |
| 2003/0002029 A1 | 1/2003 | Dukler et al. |
| 2003/0035131 A1 | 2/2003 | Dukler et al. |
| 2003/0137446 A1 | 7/2003 | Vavik |
| 2004/0159708 A1 | 8/2004 | Yogev et al. |
| 2004/0169847 A1 | 9/2004 | Dukler |
| 2004/0211840 A1 | 10/2004 | Yogev et al. |
| 2004/0217171 A1 | 11/2004 | Devos et al. |
| 2006/0109176 A1 | 5/2006 | Lee et al. |
| 2007/0103380 A1 | 5/2007 | Weste |
| 2007/0229182 A1 | 10/2007 | Gaucher et al. |
| 2008/0218413 A1 | 11/2008 | Li et al. |
| 2016/0013534 A1* | 1/2016 | Pettus ............... H01P 5/107 333/208 |

FOREIGN PATENT DOCUMENTS

| | | |
|---|---|---|
| DE | 102004045707 A1 | 3/2006 |
| EP | 0766410 A2 | 4/1997 |
| EP | 0884799 A2 | 12/1998 |
| EP | 1357395 A1 | 10/2003 |
| JP | 60-230701 | 11/1985 |
| JP | 06-038304 | 5/1994 |
| JP | 2005-536144 | 11/2005 |
| JP | 2006279199 A | 10/2006 |
| KR | 20060010867 A | 2/2006 |
| WO | 200065691 A1 | 11/2000 |
| WO | 2004004083 A1 | 1/2004 |
| WO | 2006007002 A1 | 1/2006 |
| WO | 2006102749 A1 | 10/2006 |

OTHER PUBLICATIONS

Leong, Kevin et al., "A 340-380 GHz Integrated CB-CPW-to-Waveguide Transition for Sub Millimeter-Wave MMIC Packaging", IEEE Microwave and Wireless Components Letters, vol. 19, No. 6, Jun. 2009.

European Search Report for EP Application No. 10810601.4, dated Nov. 10, 2017, pp. 1-9.

Zhang, W. et al., "3D Beamforming for Wireless Data Centers," Hotnets '11, Cambridge, MA, Nov. 14-15, 2011.

International Search Report and Written Opinion for International Patent Application No. PCT/US2010/046028 (dated Apr. 25, 2011).

Abele, P. et al, "Wafer Level Integration of a 24 GHz Differential SiGe-MMIC Oscillator with a Patch Antenna using BCB as a Dielectric Layer," 11th GAAS Symposium, 2003.

Agarwal, B et al. "A Transferred-Substrate HBT Wide-Band Differential Amplifier to 50 GHz," IEEE Microwave and Guided Wave Letters, vol. 8, No. 7, Jul. 1998.

Al-Fares et al. "A Scalable, Commodity Data Center Network Architecture," SIGCOMM '08, Seattle, WA, Aug. 17-22, 2008.

Aoki, S. et al., "A Flip Chip Bonding Technology Using Gold Pillars for Millimeter-Wave Applications," IEEE MTT-S Digest, 1997.

Bodo, P., "Low Cost Interconnect, Packaging and Sub-System Integration Technologies for Millimetrere-wave Applications," Temadag Framtidens Radar Front-End Jönköping, Mar. 9, 2005.

Boustedt, K., "GHz Flip Chip—An Overview," Ericsson Microwave Systems AB, Core Unit Research Center Microwave and High Speed Electronics, 2005.

Brauner, T., "A Differential Active Patch Antenna Element for Array Applications," IEEE Microwave and Wireless Components Letters, vol. 13, No. 4, Apr. 2003.

Clos, C., "A Study of Non-Blocking Switching Networks," The Bell System Technical Journal, Oct. 30, 1952.

Cui, Y. et al., "Wireless Data Center Networking," IEEE Wireless Communications, Dec. 2011.

Cui, Y. et al., "Channel Allocation in Wireless Data Center Networks," IEEE INFOCOM Technical Paper, 2011.

Deal, W. et al., "Integrated-Antenna Push-Pull Power Amplifiers," IEEE Transactions on Microwave Theory and Techniques, vol. 47, No. 8, Aug. 1999.

Gilleo, K., "Chip Scale or Flip Scale—the Wrong Question?", Cookson Electronics, 1998.

Halperin, D. et al., "Augmenting Data Center Networks with Multi-Gigabit Wireless Links," SIGCOMM '11 Toronto, Ontario, Canada, Aug. 15-19, 2011.

Hang, C. et al., "High-Efficiency Push-Pull Power Amplifier Integrated with Quasi-Yagi Antenna," IEEE Transactions on Microwave Theory and Techniques, vol. 49, No. 6, Jun. 2001.

Higginbotham, S., "Forget Ethernet, Researchers Want Data Centers to Go Wireless," Internet article, Dec. 20, 2011.

Jentzsch, A. et al., "Theory and Measurements of Flip-Chip Interconnects for Frequencies up to 100 GHz," IEEE Transactions on Microwave Theory and Techniques, vol. 49, No. 5, May 2001.

Karnfelt, C. et al, "Flip Chip Assembly of a 40-60 GHz GaAs Microstrip Amplifier," 12th GAAS® Symposium—Amsterdam, 2004.

(56) References Cited

OTHER PUBLICATIONS

Katayama Y. et al., "Wireless Data Center Networking with Steered-Beam mmWave Links," IEEE WCNC 2011—Service and Application, 2011.
Graham-Rowe, D., "Bouncing Data Would Speed Up Data Centers," MIT Published Article, http://www.technologyreview.com/communications/39367/?ref=rss, Dec. 20, 2011.
Owano, N., "Bouncing Signals Off Ceiling Can Rev Up Data Centers," PhysOrg.com, Published Dec. 21, 2011.
Pfeiffer, U., et al., "A 60GHz Radio Chipset Fully-Integrated in a Low-Cost Packaging Technology," 2006 Electronic Components and Technology Conference, 2006.
Pfeiffer, U., et al., "A Chip-Scale Packaging Technology for 60-GHz Wireless Chip Sets," IEEE Transactions on Microwave Theory and Techniques, vol. 54, No. 8, Aug. 2006.
Pfeiffer, U., et al., "Equivalent Circuit Model Extraction of Flip-Chip Ball Interconnects Based on Direct Probing Techniques," IEEE Microwave and Wireless Components Letters, vol. 15, No. 9, Sep. 2005.
Pfeiffer, U., "Low-loss Contact Pad with Tuned Impedance for Operation at Millimeter Wave Frequencies," IEEE SPI 2005, 2005.
Ramachandran, K. et al., "60 GHz Data-Center Networking: Wireless Worry Less?" WINLAB, Rutgers University and NEC Laboratories America, NJ, Jul. 14, 2008.
Schrank, H. et al., "Analysis of the Radiation Resistance and Gain of a Full-Wave Dipole," IEEE Antennas and Propagation Magazine, vol. 36, No. 5, Oct. 1994.
Shin, J. et al., "On the Feasibility of Completely Wireless Data Centers," Department of Computer Science, Cornell University and Microsoft Research, May 3, 2011.
Staiculescu, D. et al., "Flip Chip vs. Wirebond," Printed Circuit Design, Jun. 2012.
Barroso, L. et al., "The Datacenter as a Computer, An Introduction to the Design of Warehouse Scale Machines", 2009.
Vardhan, H. et al., "Wireless Data Center with Millimeter Wave Network," IEEE Globecom 2010 Proceedings, 2010.
Viallon, C. et al., "Microwave Differential Structures Optimization: Application to a Double Balanced SiGe Active Down-Converter Design," IEEE International Workshop on Radio-Frequency Integration Technology, Singapore, Nov. 30-Dec. 2, 2005.

\* cited by examiner

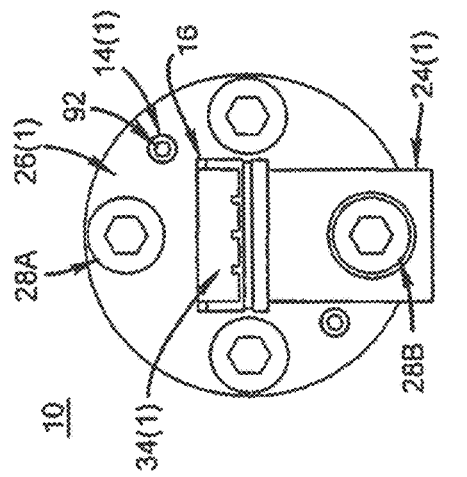
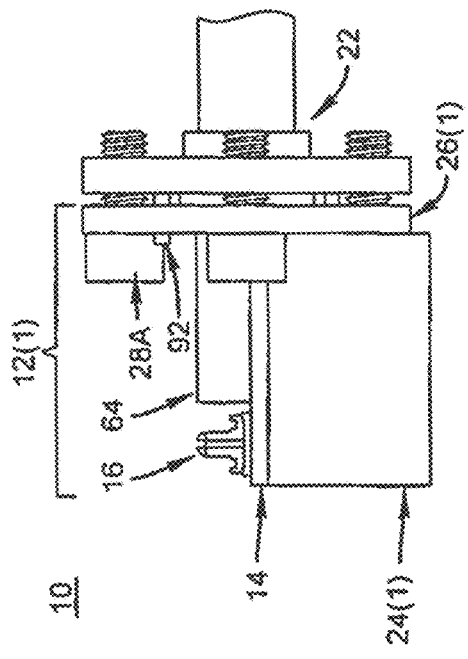
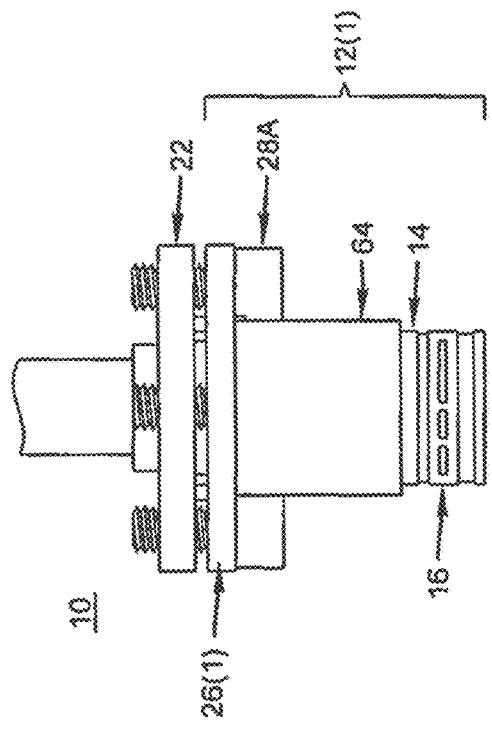

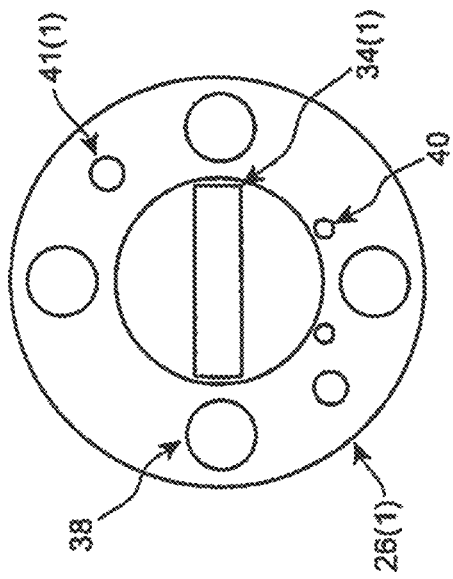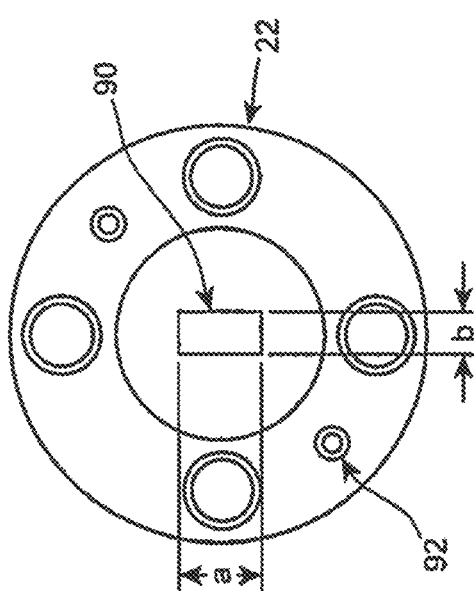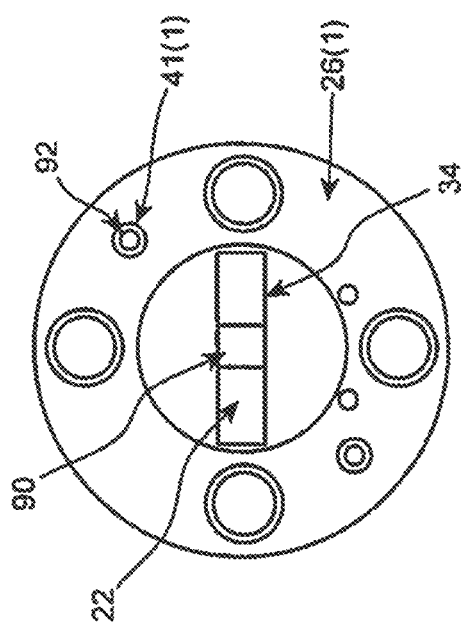

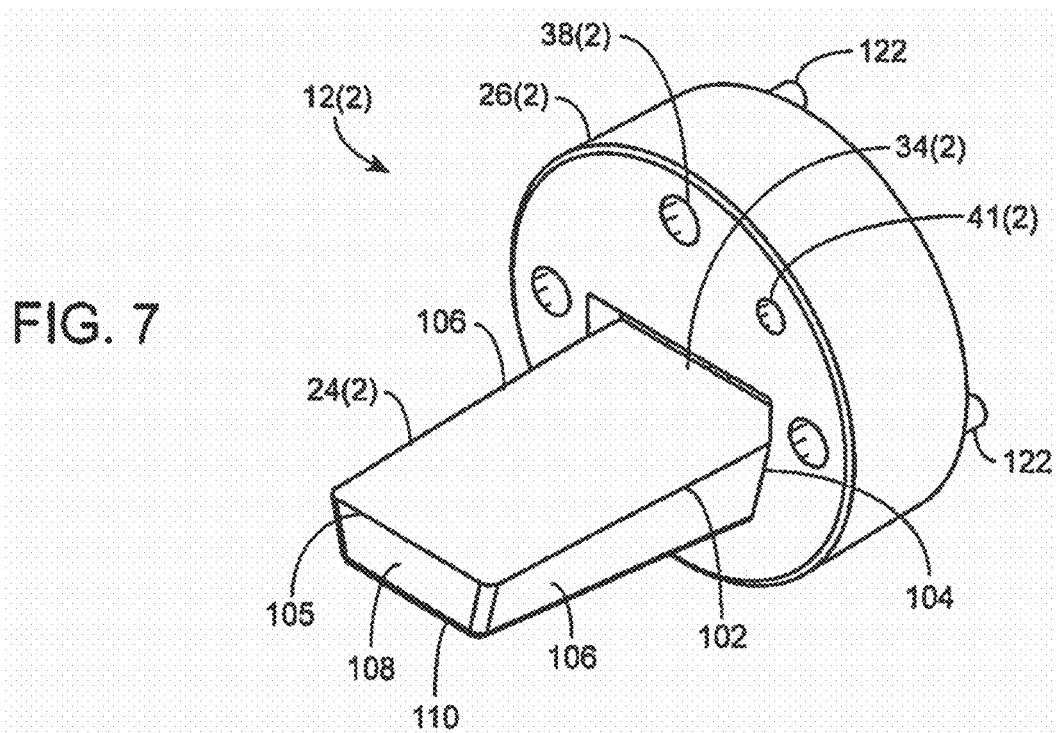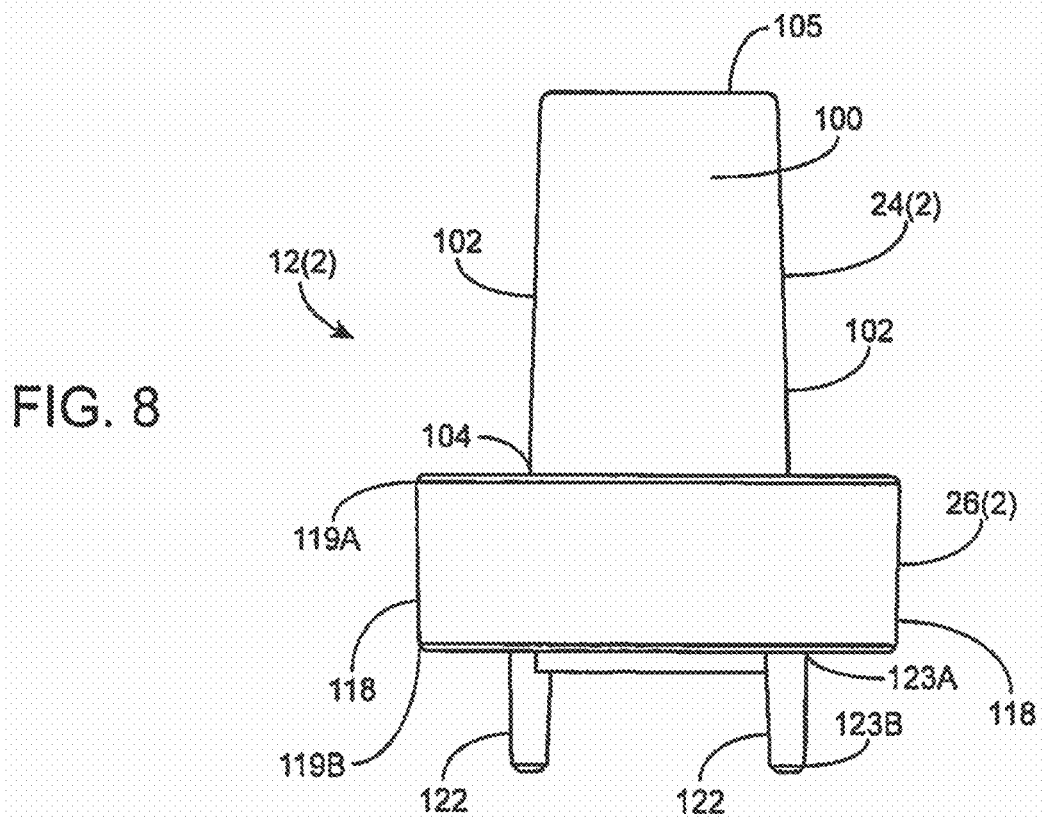

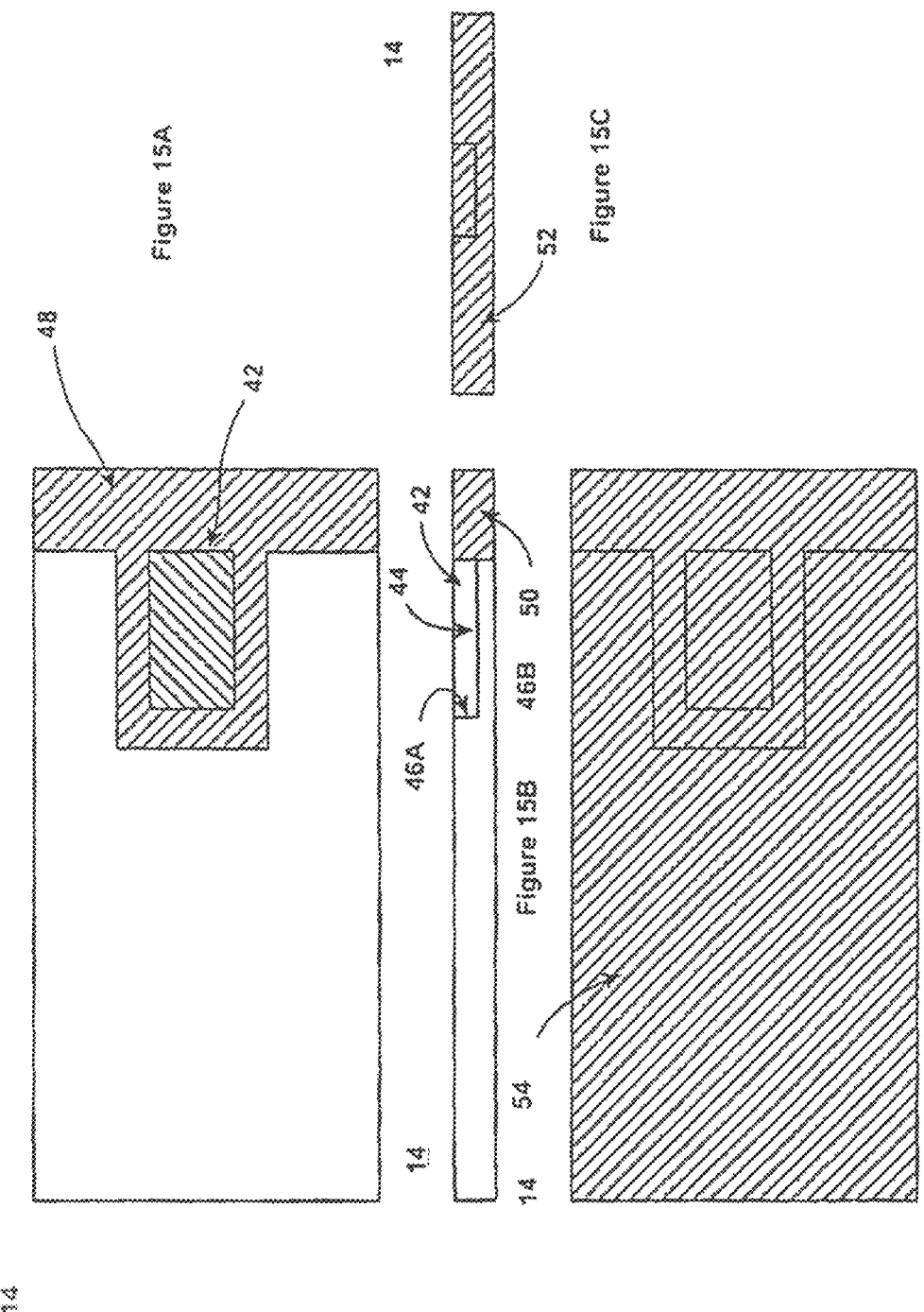

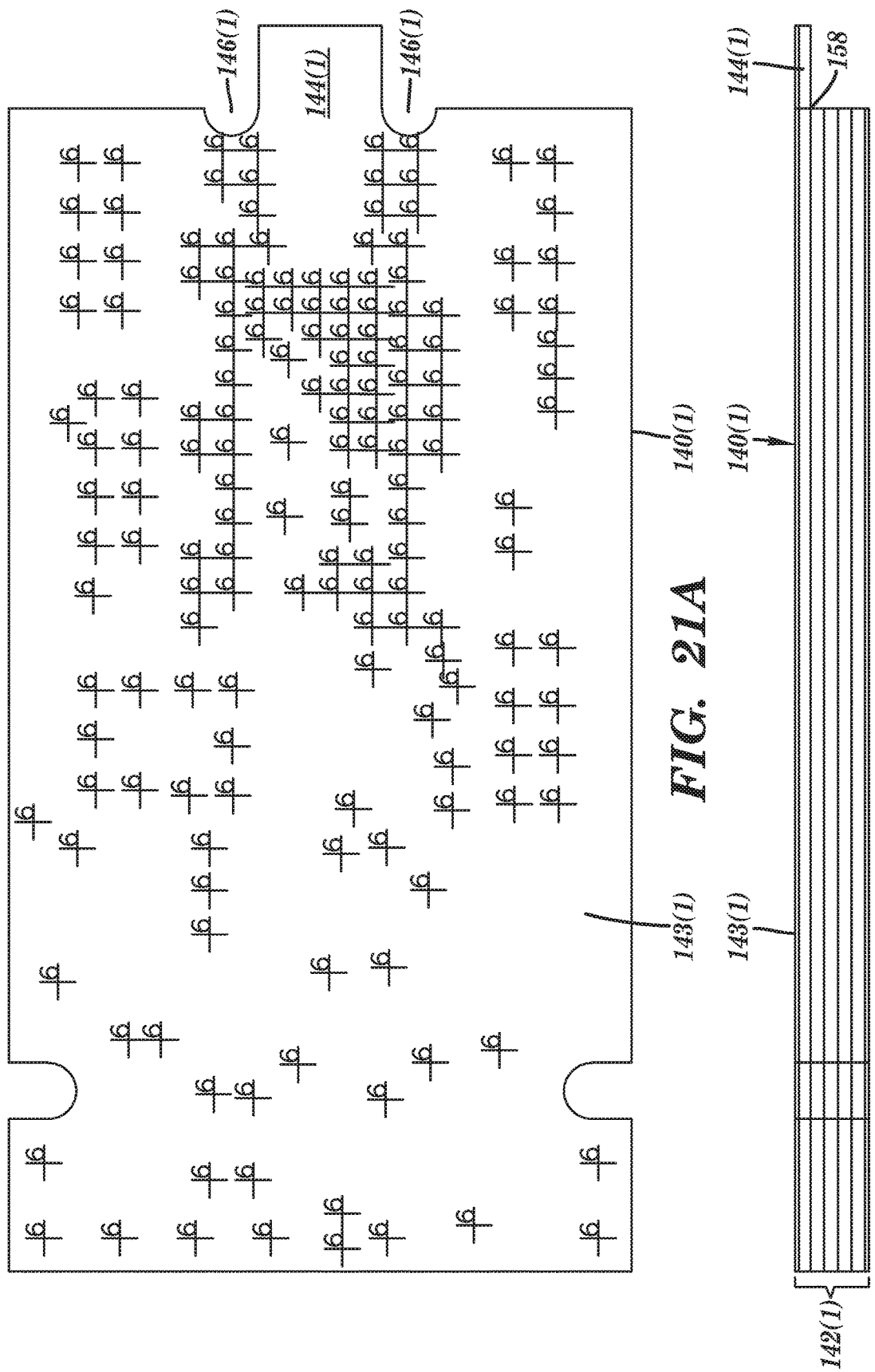

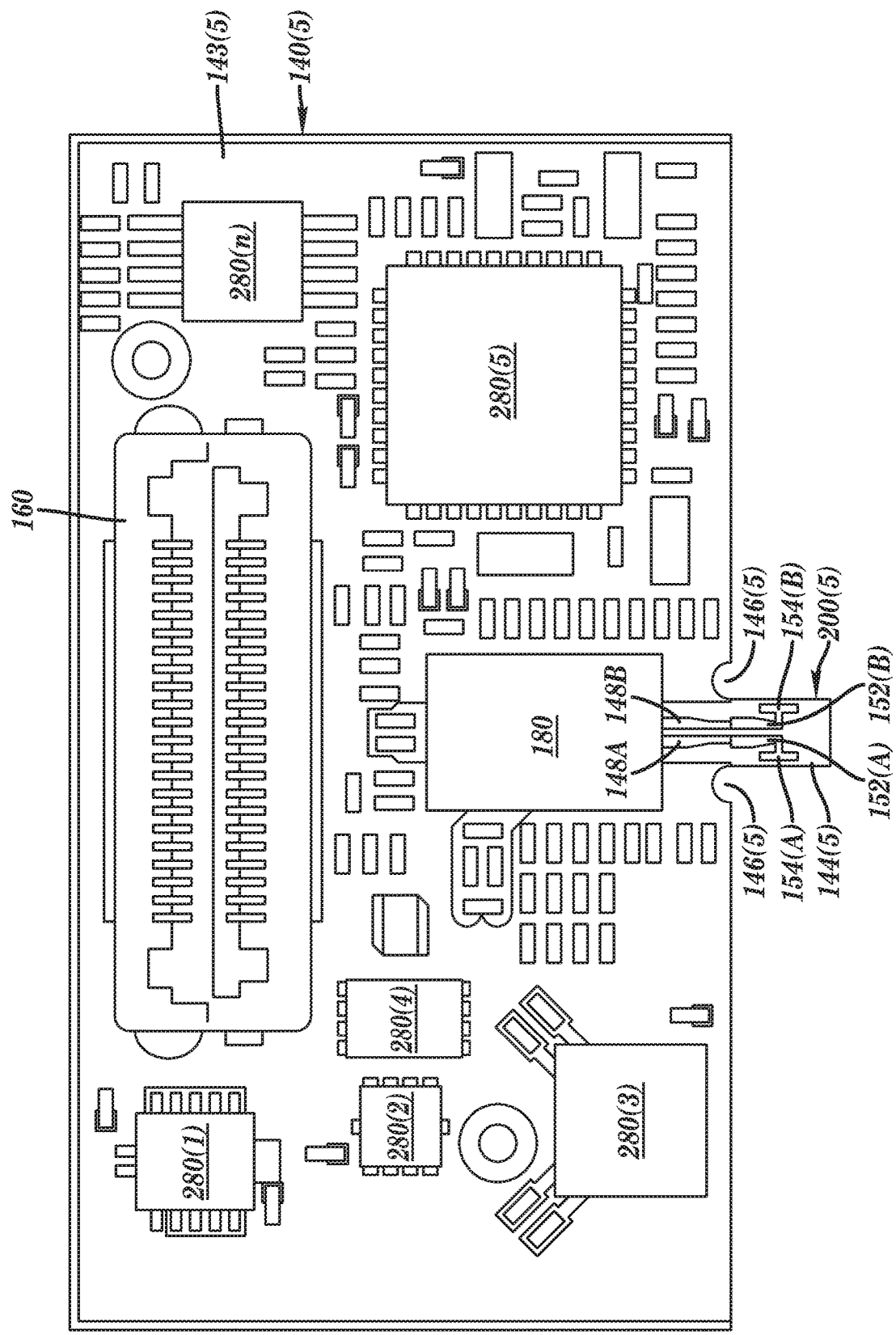

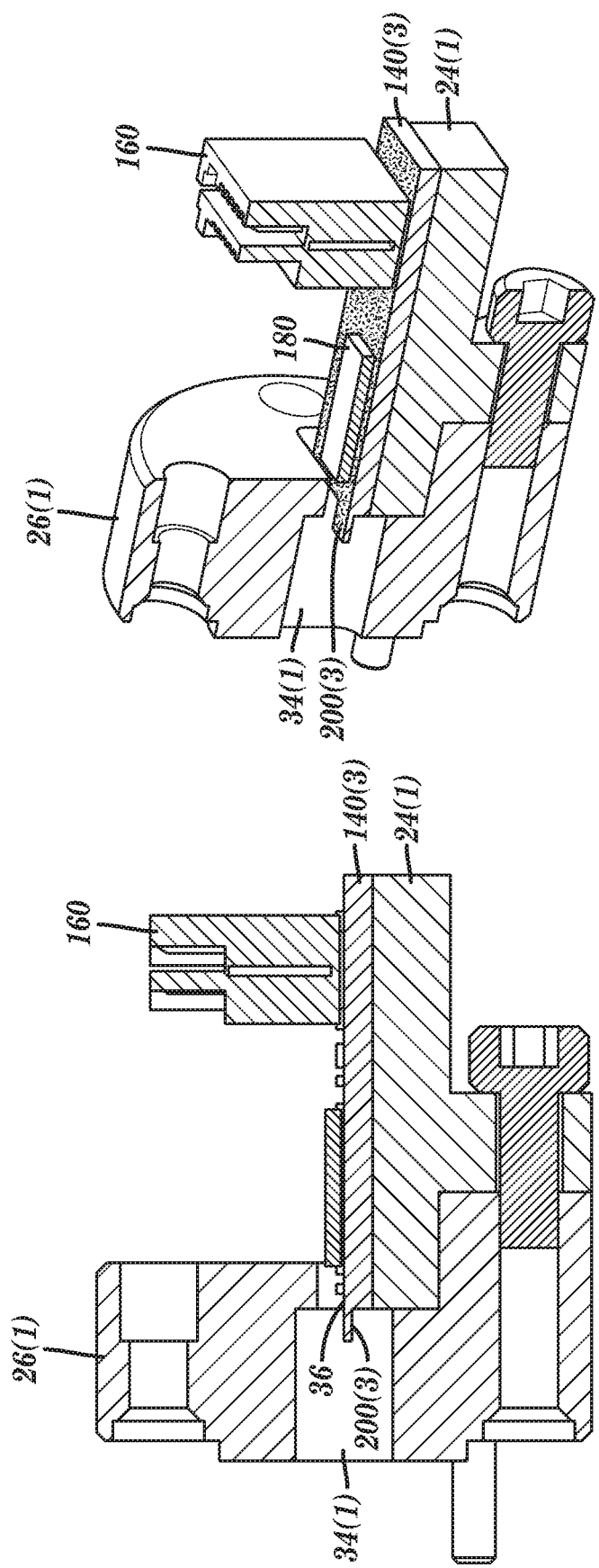

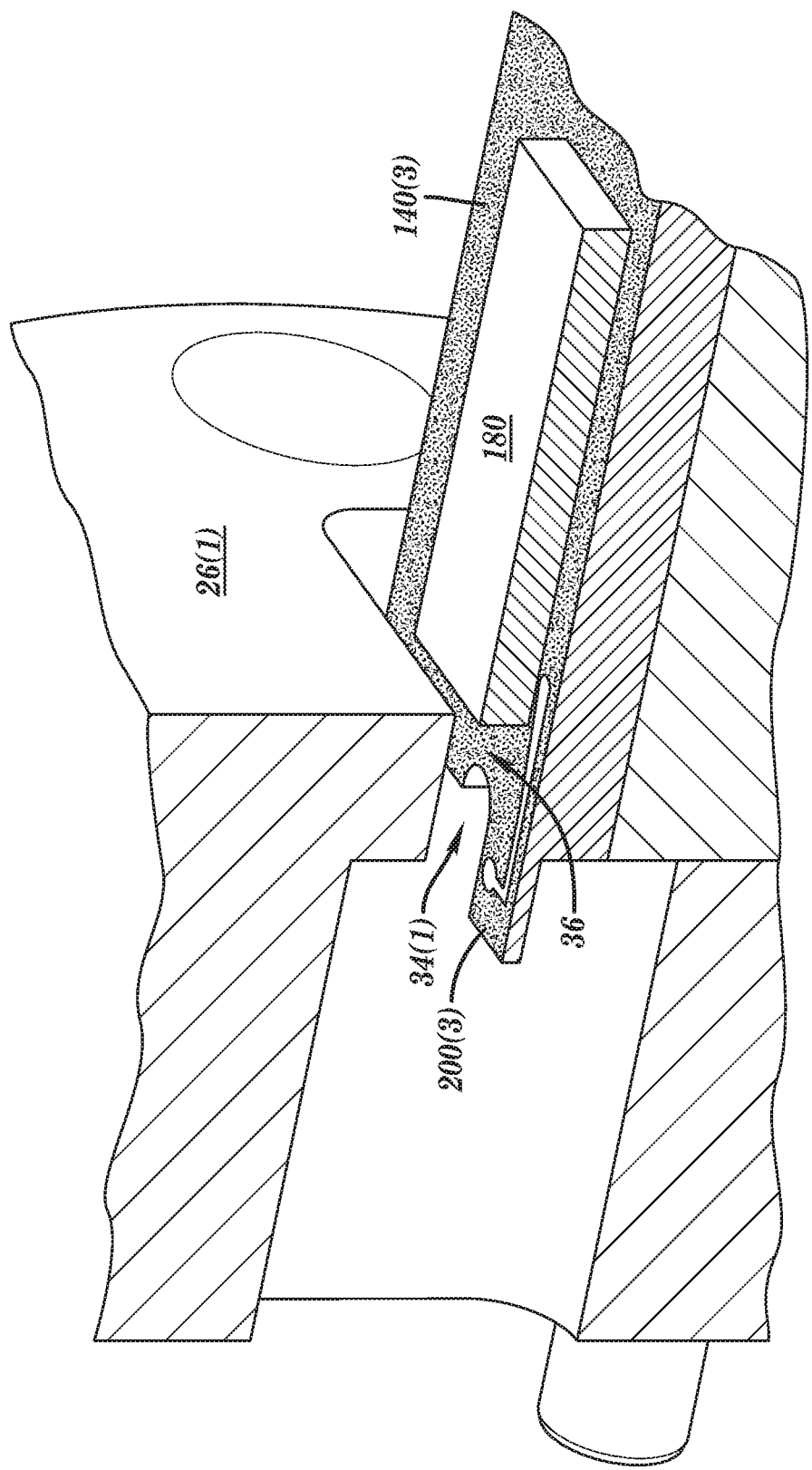

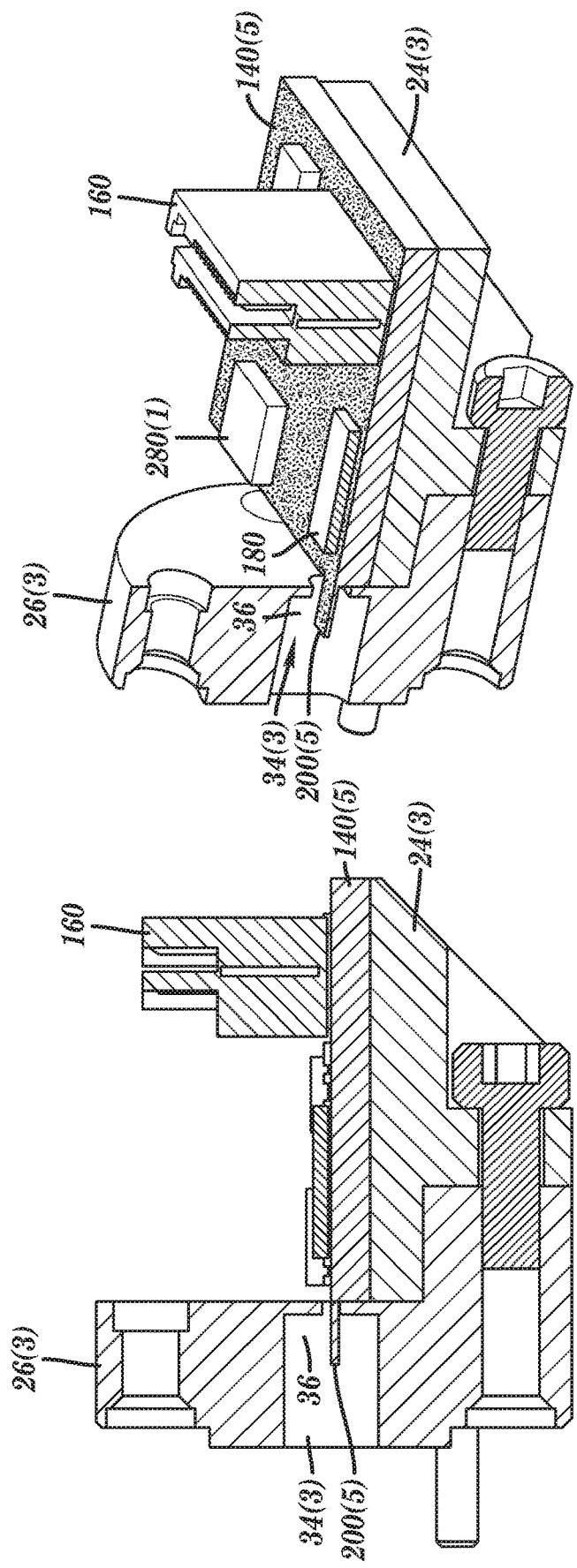

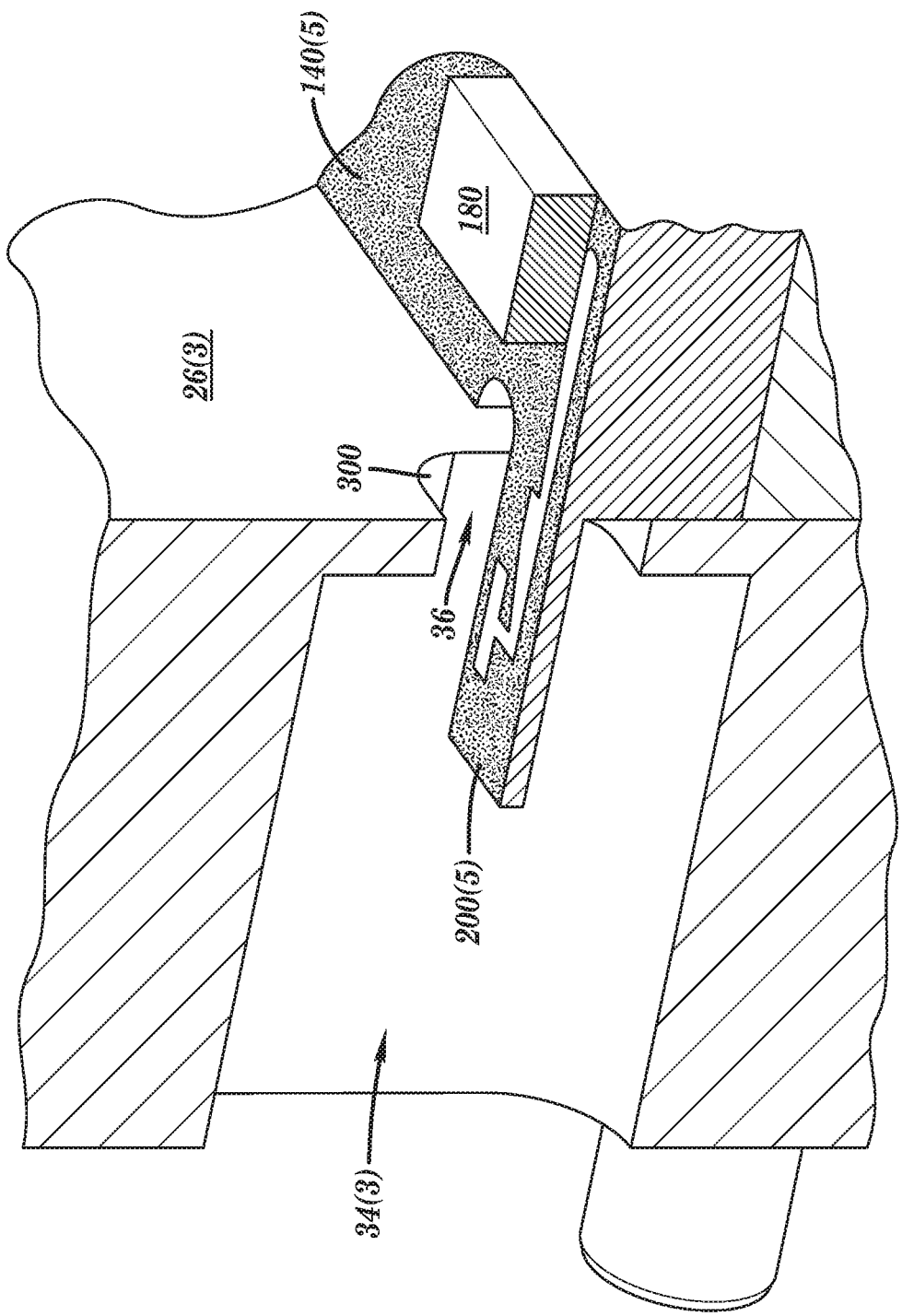

WAVEGUIDE INTERFACE AND PRINTED CIRCUIT BOARD LAUNCH TRANSDUCER ASSEMBLY AND METHODS OF USE THEREOF

FIELD

The present disclosure relates generally to a waveguide interface and printed circuit board launch transducer assembly for microwave and millimeter wave radio frequency technologies. More specifically, the present disclosure relates to a waveguide interface including a printed circuit board with an integrated launch transducer that may utilized with surface mounted millimeter wave semiconductor integrated circuits.

BACKGROUND

As the semiconductor industry continues to increase circuit complexity and density by reduction of process node geometries, operating signal frequencies continue to increase. It is now possible to obtain semiconductors that operate well into the millimeter wave region of radio spectrum (30 GHz to 300 GHz). Traditionally, the types of semiconductors used have been in the category of "III-V" types, indicating that the semiconductor compounds have been derived from periodic table elements in the third and fifth columns, such as gallium arsenide (GaAs) and indium phosphide (InP). In recent years, less expensive semiconductor processes that arise from column IV of the periodic table, such as silicon (Si) and germanium (Ge) have been produced in silicon CMOS (complementary metal oxide semiconductor) and silicon germanium (SiGe) compounds. The result has been to extend the operating frequency of low-cost silicon semiconductors well into the 60 to 80 GHz range of frequencies. The availability of low-cost semiconductor technology has put pressure on millimeter wave manufactures to bring the overall costs down for the electromechanical support mechanisms that enable these semiconductor devices.

Commercial waveguide structures enable low-loss energy transfer at millimeter wave frequencies, with the additional benefit of standardization of size and mechanical coupling flange designs. The standardized sizes and coupling flanges enable interoperability between different devices and different manufactures, providing maximal flexibility for millimeter wave system design.

One method for interfacing semiconductor devices within a mechanical waveguide has been to couple energy from an orthogonal planar printed circuit launch probe with associated lossy energy transfer. Energy is coupled in and out of semiconductor devices by providing a printed circuit board with a stub or paddle energy launch attached as an additional substrate on the printed circuit board. The stub or paddle launch is orthogonal to the waveguide cavity, also requiring a split-cavity type of assembly method, creating additional expense.

In prior waveguide interface devices, a semiconductor die (non-packaged) is utilized, which requires wire bonding from the die pads to the printed circuit board. Wire bonding is an expensive process and is prone to errors and yield problems. Wafer level chip scale packaging (WLCSP) is emerging as a high-efficiency packaging technique for millimeter wave semiconductor integrated circuits. WLCSP allows the device to be processed directly onto the printed circuit board assembly using standard surface mount technologies, which provides cost savings. However, standard launch transducer technologies utilized in the art, which require an additional substrate on the printed circuit board assembly or attempt to launch millimeter wave energy orthogonally to a waveguide aperture, are either not compatible or inefficient with WLCSP packaging techniques.

SUMMARY

A waveguide assembly includes a support block and a waveguide interface coupled to an end portion of the support block and extending from the support block. The waveguide interface has a slot and one or more holes positioned to receive attachment devices to secure the waveguide interface to a waveguide flange. A printed circuit board assembly includes a plurality of layers, at least one of the plurality of layers formed of a dielectric material and having an extended portion extending beyond the other layers in the plurality of layers, wherein the extended portion is configured to be inserted into the slot in the waveguide interface when the printed circuit board assembly is positioned on the support block. A first metallic layer is located on at least a portion of the extended portion of the dielectric layer. The first metallic layer and the dielectric layer are configured to form a launch transducer comprising one or more transmission lines and at least one transducer element coupled to the one or more transmission lines. The transducer element is configured to propagate millimeter wave frequency signals and is configured to be located in the slot in the interface when the printed circuit board assembly is positioned on the support block.

A printed circuit board assembly comprising a plurality of layers. At least one of the plurality of layers is formed of a dielectric material and has an extended portion extending beyond the other layers in the plurality of layers. A first metallic layer is located on at least a portion of the extended portion of the dielectric layer. The first metallic layer and the dielectric layer are configured to form a launch transducer comprising one or more transmission lines and at least one transducer element coupled to the one or more transmission lines. The transducer element is configured to propagate millimeter wave frequency signals.

A method of forming a printed circuit board assembly includes providing a plurality of layers, at least one of the plurality of layers formed of a dielectric material. The plurality of layers is milled such that the at least one of the plurality of layers formed of a dielectric material has an extended portion extending beyond the other layers in the plurality of layers. A first metallic layer is deposited on at least a portion of the at least one of plurality of layers formed of the dielectric material. The first metallic layer and the dielectric layer are configured to form a launch transducer comprising one or more transmission lines and one or more transducer elements coupled to the one or more transmission lines. The transducer element is configured to propagate millimeter wave frequency signals.

This exemplary technology provides a number of advantages including providing a printed circuit board assembly including an integrated launch transducer device that is compatible with wafer level chip scale packaging techniques for millimeter wave semiconductor integrated circuits. The printed circuit board assembly with the integrated transducer device may be employed in waveguide interfaces employed at high operating frequencies. The printed circuit board assembly with integrated transducer device allows for wafer level chip scale packaging of the semiconductor integrated circuits employed with the launch transducer with nominal impact on the overall performance, which eliminates the need for expensive wire bonding.

BRIEF DESCRIPTION OF THE DRAWINGS

FIGS. 1A-1C are side, front end, and top views, respectively, of an exemplary waveguide assembly including an exemplary waveguide interface coupled to a waveguide flange;

FIG. 5A is a rear view of an exemplary waveguide flange;

FIG. 5B is rear view of the interface plate of the exemplary waveguide interface shown in FIGS. 1A-1C;

FIG. 5C is a rear view of the exemplary waveguide flange shown in FIG. 5A coupled to the exemplary interface plate shown in FIG. 5B;

FIG. 7 is a perspective view of another exemplary waveguide interface that is molded as a single, monolithic device;

FIG. 8 is a top view of the exemplary waveguide interface shown in FIG. 7;

FIGS. 15A-15D are a top, side, end, and bottom view of an exemplary printed circuit board for use with the exemplary waveguide interfaces of the present technology;

FIGS. 21A-21C are top, side cross-sectional, and end cross-sectional views of the fabrication of the exemplary printed circuit board illustrated in FIG. 20;

FIGS. 27A and 27B are top and bottom views of an exemplary printed circuit board assembly with an integrated transmitter launch transducer and having a wide body configuration for use with the exemplary waveguide interfaces of the present technology;

FIGS. 29A-29D are a perspective view, a top view, a side cross-sectional view, and a perspective cross-sectional view of an exemplary printed circuit board assembly having a narrow body configuration located on a waveguide interface;

FIG. 29E is a perspective cross-sectional view of a portion of the exemplary printed circuit board assembly having a narrow body configuration located on a waveguide interface shown in FIGS. 29A-29D;

FIGS. 30A-30D are a perspective view, a top view, a side cross-sectional view, and a perspective cross-sectional view of an exemplary printed circuit board assembly having a wide body configuration located on a waveguide interface;

FIG. 30E is a perspective cross-sectional view of a portion of the exemplary printed circuit board assembly having a wide body configuration located on a waveguide interface shown in FIGS. 30A-30D.

DETAILED DESCRIPTION

Figure 2:
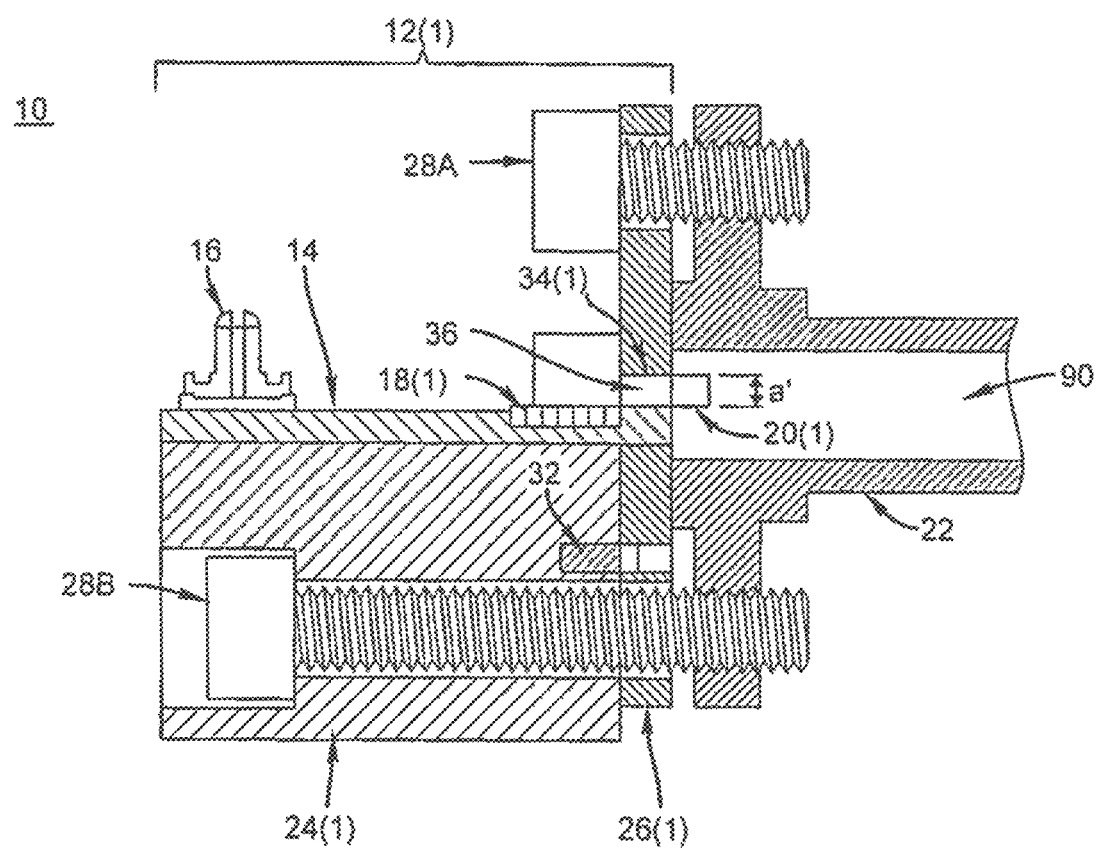
FIG. 2 is a cross sectional side view of the exemplary waveguide assembly shown in FIGS. 1A-1C.
Figure 3:
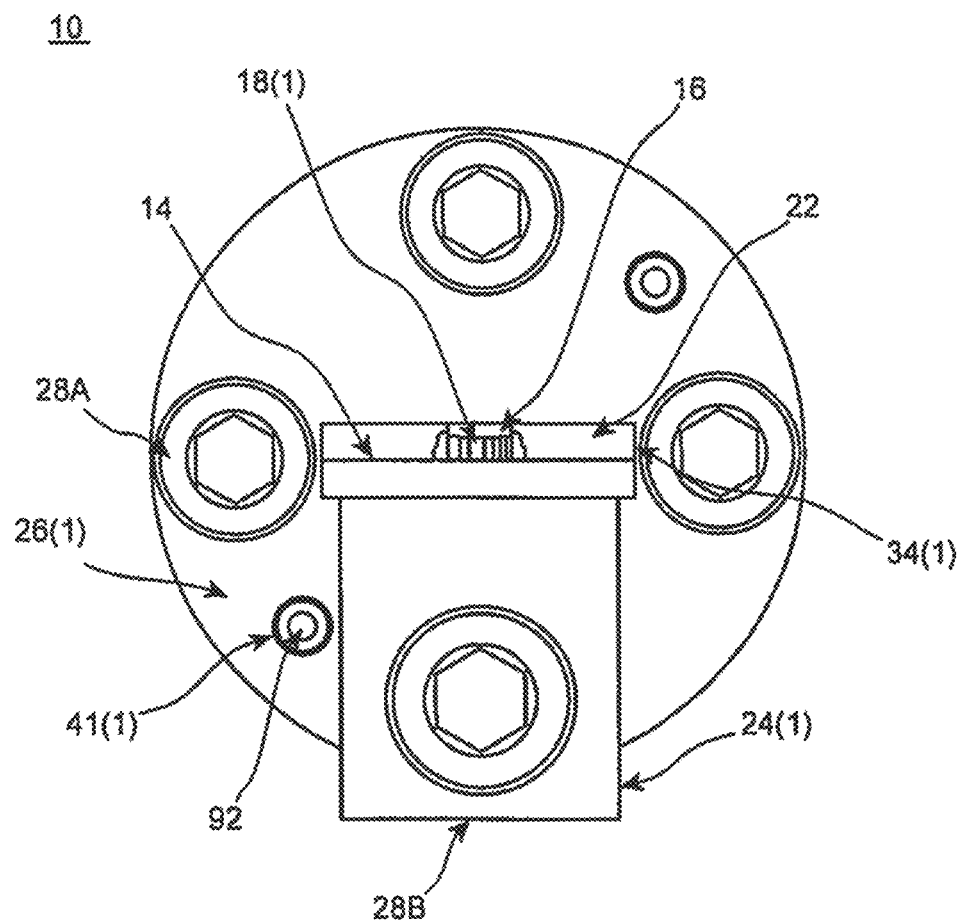
FIG. 3 is a detailed rear view of the exemplary waveguide assembly shown in FIGS. 1A-1C.
Figure 4:
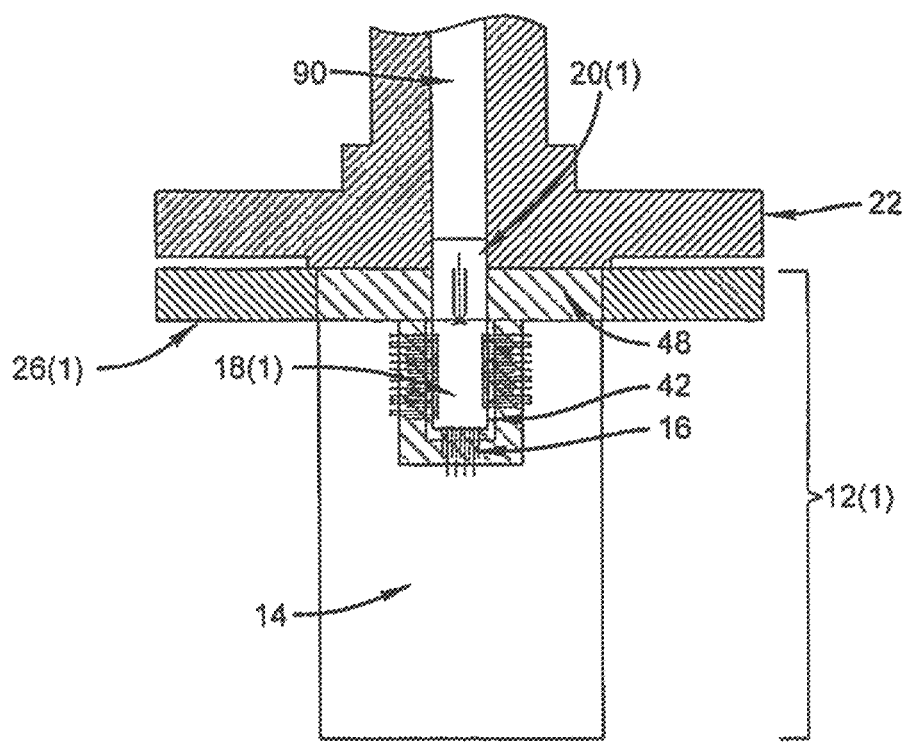
FIG. 4 is a cross sectional top view of the exemplary waveguide assembly shown in FIGS. 1A-1C.

Referring to FIGS. 1A-4, an example of a waveguide assembly 10 includes an exemplary waveguide interface 12(1), a printed circuit board assembly 14 including a connector 16, a communication device 18(1), and a launch transducer 20(1), and a waveguide flange 22, is illustrated, although the waveguide assembly 10 could include other types and numbers of assemblies, devices, components, and/or other elements in other configurations. In another example, as described below with respect to FIGS. 20-24C, the waveguide assembly 10 may incorporate a printed circuit board assembly 140(1) or 140(2) formed from a plurality of layers with an integrated launch transducer formed from one of the layers.

As described below, the waveguide assembly 10 may be utilized for electromagnetic transmission and electromagnetic reception. Both the transmission context and the reception context equally apply due to the Lorentz electromagnetic reciprocity theorem. This exemplary technology provides a number of advantages including providing a waveguide assembly, including a waveguide interface that may be utilized at high operating frequencies. The waveguide assembly of the present technology incorporates, in one example, a printed circuit board assembly with an integrated launch transducer with nominal impact on the overall performance of the waveguide assembly. The printed circuit board assembly with the integrated launch transducer allows for incorporating semiconductor integrated circuits using surface mount technologies, which significantly reduces the overall cost of the waveguide assembly.

Referring again to FIGS. 1A-6C, the exemplary waveguide interface 12(1) includes a support block 24(1) coupled to an interface plate 26(1), although the waveguide interface 12(1) may include other elements in other configurations. The waveguide interface 12(1) operates in the waveguide assembly 10 to provide an interface between the waveguide flange 22 and the communication device 18(1). In one example, as described further below, a waveguide interface may be utilized in the waveguide assembly 10 that is constructed as a single, monolithic, metal injection-molded structure, such as the waveguide interface 12(2) illustrated in FIGS. 7-14. The metal injection-molded waveguide interface 12(2) advantageously provides a more economically produced waveguide interface that may be utilized at high operating frequencies, with nominal impact on the performance of the waveguide assembly 10.

Referring again to FIGS. 1A-4, the support block 24 (1) is configured to support the printed circuit board assembly 14 having the connector 16, the communication device 18(1), and the launch transducer 20(1) located on a surface thereof. The support block 24(1) extends in a plane orthogonal to the interface plate 26(1) and provides for precise alignment of the printed circuit board assembly 14 with the interface plate 26(1) and the waveguide flange 22. In another example, the support block 24(1) may also be utilized with printed circuit board assembly 140(1) or 140(2) as described below with respect to FIGS. 20-24C.

Referring again to FIGS. 1-4A, the support block 24(1), in this example, is coupled to the interface plate 26(1) and the waveguide flange 22 by machine screws 28A and 28B, although other types of fasteners may be utilized. Machine screws 28A and 28B couple both the support block 24(1) and the interface plate 26(1) to the waveguide flange 22 such that the interface plate 26(1) is positioned between the support block 24(1) and the waveguide flange 22. In another example, as illustrated in FIGS. 7-14, the support block 24(2) and the interface 26(2) are molded as a single device and do not require any fastening elements to be coupled together.

Figure 6C:
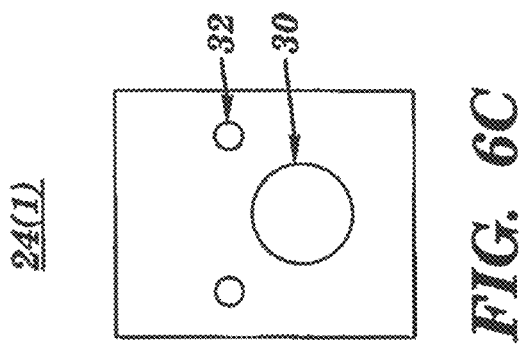
FIGS. 6A-6C are a front view, side cross-sectional view, and an end view of a support block of the exemplary waveguide interface shown in FIGS. 1A-1C.
Figure 6B:
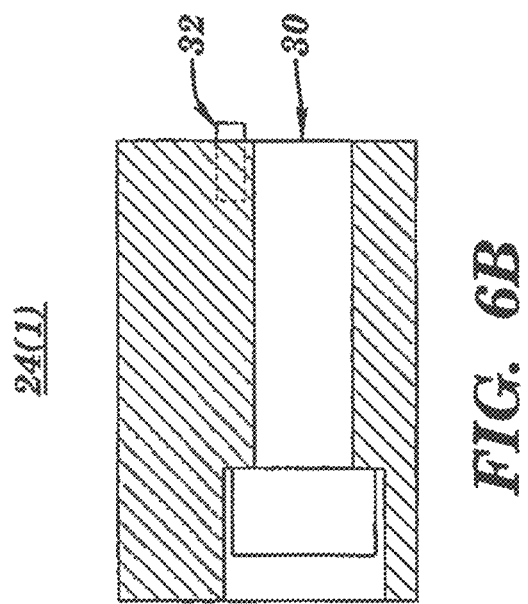
Figure 6A:
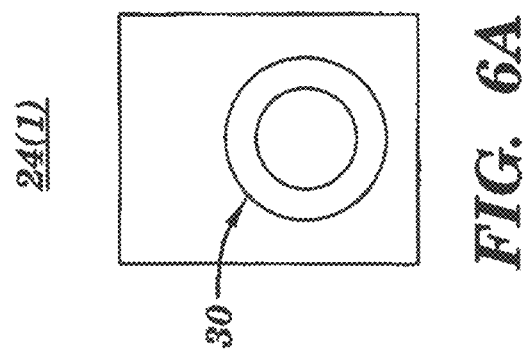
Figure 9:
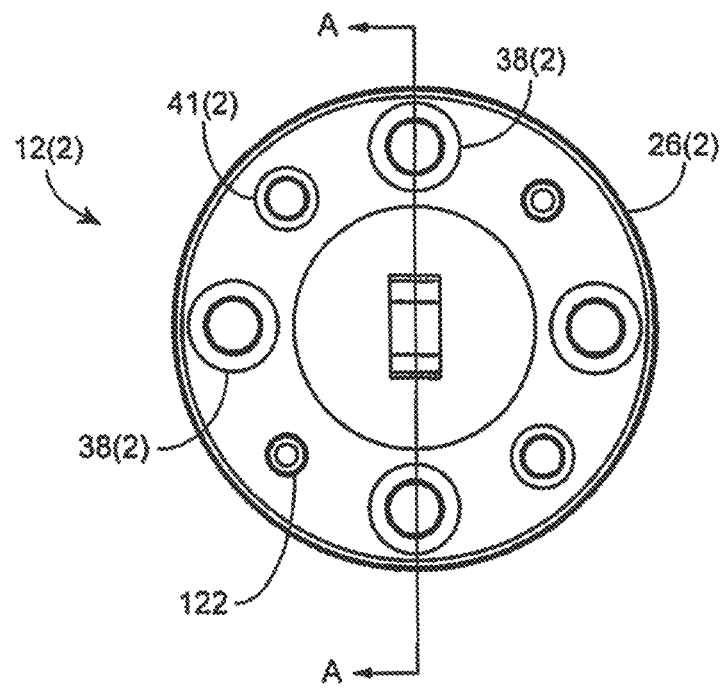
FIG. 9 is a rear view of the exemplary waveguide interface shown in FIG. 7.
Figure 10:
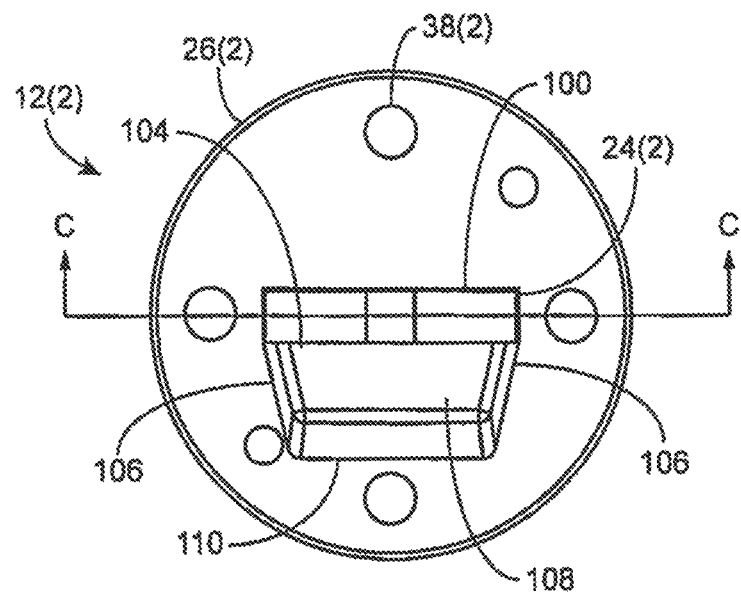
FIG. 10 is a front view of the exemplary waveguide interface shown in FIG. 7.

Referring now to FIGS. 6A-6C, in one example, the support block 24(1) includes a counter-bored hole 30 that allows the machine screw 28B to be inserted therein to couple the support block 24(1) to the waveguide flange 22 and the interface plate 26(1), as shown in FIG. 2A, although the support block 24(1) may include other fastening elements in other locations to facilitate the coupling of the support block 24(1) to the interface plate 26(1) and waveguide flange 22. In one example, as described below, support block 24(2) and interface 26(2) are formed as a single, monolithic, part, such that no fastening elements are required on support block 24(2). As shown in FIGS. 6B and 6C, the support block 24(1) optionally includes one or more support block guide pins 32 that aid in alignment of the support block 24(1) with the interface plate 26(1) as discussed further below.

Referring now more specifically to FIGS. 1A-4 and 5B, interface plate 26(1) is a circular interface plate, although other configurations may be utilized for the interface plate 26(1). The interface plate 26(1) includes a rectangular slot 34(1) located therethrough. The length of the rectangular slot 34(1) is configured to accept the printed circuit board assembly 14 and the launch transducer 20(1) as illustrated in FIG. 2. The printed circuit board assembly 14 and the rectangular slot 34(1) form a short waveguide segment 36 within the rectangular slot 34(1) when coupled.

Referring again to FIG. 5B, the interface plate 26(1) includes interface plate holes 38 which are sized and configured to receive machine screws 28A and 28B, which secure the waveguide interface 12(1) to the waveguide flange 22. The interface plate 26(1) may further have interface plate guide pin holes 40 that may be aligned with support block guide pins 32 of the support block 24(1) to provide precise alignment between the interface plate 26(1) and the support block 24(1). The interface plate 26(1) further includes guide pin holes 41 that are configured to aid in alignment with the waveguide flange 22 as described further below.

Referring now to FIGS. 7-14, another example of a waveguide interface 12(2) for use in waveguide assembly 10 is illustrated. Waveguide interface 12(2) interacts with waveguide flange 22 and operates in the same manner as waveguide interface 12(1) except as illustrated and described herein.

Waveguide interface 12(2) includes a support block 24(2) and an interface 26(2) that are molded in an injection molding process as a single, monolithic structure, although other types of molding techniques may be utilized. The waveguide interface 12(2), by way of example only, may be constructed of an injection moldable metal alloy such as Xyloy™ M950, although other types of moldable metal alloys may be utilized to form the waveguide interface 12(2). The outer shape of the waveguide interface 12(2) has been customized to allow for removal from a mold to enable the generation of the single monolithic structure, as discussed below. Specifically, the waveguide interface 12(2) includes a plurality of draft angles as discussed below. The draft angles, discussed more specifically below, provide for removal of the waveguide interface 12(2) without significant impact to the overall performance on the waveguide interface 12(2) in the waveguide assembly 10. In particular, by way of example only, the propagation of millimeter wave energy into the opening of a waveguide flange connected to the waveguide interface 12(2) is altered by less than one percent, which does not impact the overall operating frequency range. Further, the waveguide cutoff frequency is altered by less than one percent. Although various exemplary dimensions are described below, it is to be understood that the dimensions may be varied.

Figure 12:
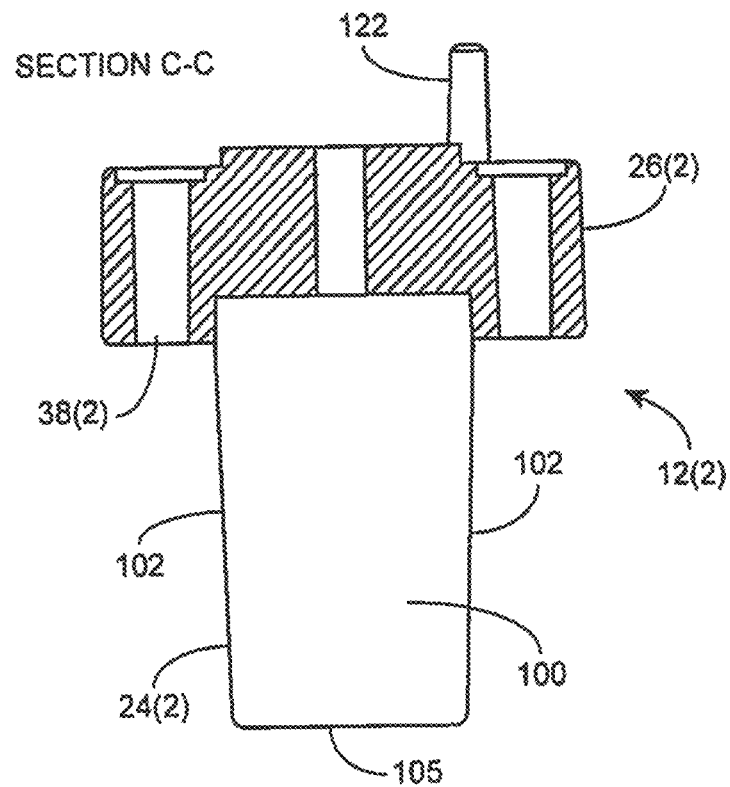
FIG. 12 is a top cross-sectional view of the exemplary waveguide interface shown in FIG. 7.

Support block 24(2) includes a top surface 100 configured to support a printed circuit board assembly (not shown), such as printed circuit board assembly 14 or printed circuit board assembly 140, by way of example. By way of example, the printed circuit board assembly may be attached to the top surface 100 of the support block 24(2) using an adhesive. The top surface 100 has side edges 102 that are tapered with a draft angle of approximately a 4 degree angle as illustrated in FIGS. 8 and 12. The top surface 100 of the support block 24(2) has a width of approximately 0.400 inches at a junction 104 with the interface 26(2) and a width of approximately 0.358 inches at an upper end edge 104 thereof.

The support block 24(2) includes sides 106 and end 108 that taper downward from the top surface 100 with a draft angle of approximately 4 degrees, such that the support block 24(2) has a width of approximately 0.315 inches at a lower end edge 110. The support block 24(2) further includes a tapered bottom surface 112 at a draft angle of approximately 4 degrees as shown in FIG. 11, such that support block 24(2) has a height of approximately 0.177 inches at the junction 104 with the interface 26(2) and a width of approximately 0.120 inches from the lower end edge 110 to the top surface 100, although support block 24(2) may have other dimensions.

In this example, with the modified design with the draft angles and dimensions noted above, the support block 24(2) and the interface 26(2) can be molded as a single, monolithic device. The support block 24(2) extends from the interface 26(2) in a plane orthogonal to the interface 26(2). The interface 26(2) is a circular interface configured to be coupled to a waveguide flange (not shown), such as waveguide flange 22, which by way of example may be a standard waveguide flange known in the art. The interface 26(2) includes a slot 34(2) configured to receive a portion of a printed circuit board assembly, including a launch transducer. In use, the slot 34(2) and an inserted printed circuit board assembly form a short waveguide segment within the waveguide interface 12(2) in the same manner as described with respect to the waveguide interface 12(1) above.

Figure 11:
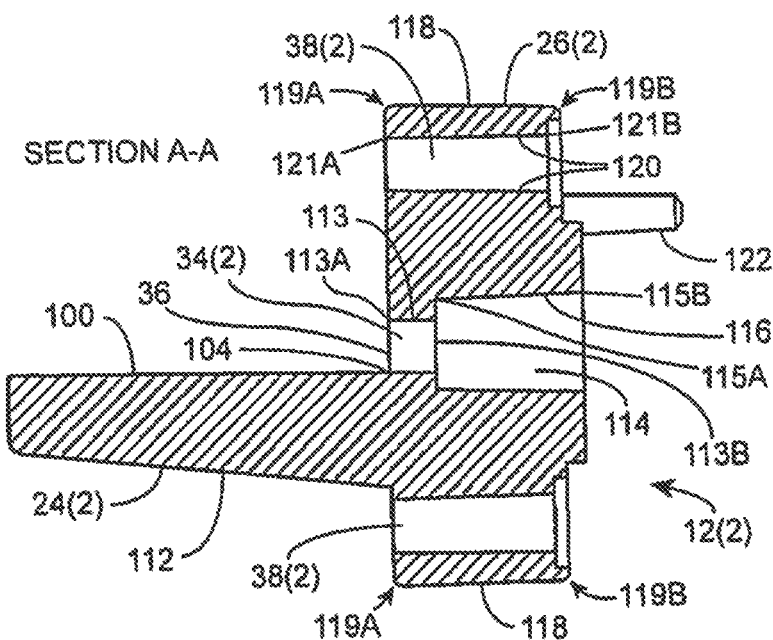
FIG. 11 is a side cross-sectional view of the exemplary waveguide interface shown in FIG. 7.

In this example, the slot 34(2) has width of approximately 0.400 inches and a height of approximately 0.080 inches at the front opening as illustrated in FIG. 11. The slot 34(2) includes a tapered top surface 112 with a draft angle of approximately 2.0 degrees from a front end 113A to a rear end 113B of the slot 34(2). The slot 34(2) also includes a rear portion 114 with a tapered side 116 with a draft angle of approximately 4 degrees from a front end 115A to a rear end 115B of the rear portion 114. The rear portion 114 meets with an opening in a standard waveguide flange.

The interface 26(2) includes outer edges 118 with a draft angle of approximately 2 degrees from a front end 119A to a rear end 119B of the outer edge 118 as shown in FIG. 8. The interface 26(2) further includes a number of interface holes 38(2) located therethrough. The interface holes 38(2) are configured to receive machine screws to facilitate coupling of the waveguide interface 12(2) to a waveguide flange. The interface holes 38(2) include tapered side walls 120 with a draft angle of approximately 2 degrees from a front end 121A to a rear end 121B of the side walls 120 to facilitate removal from the mold as shown in FIG. 11. The interface holes 38(2) are drilled or reamed and tapped with 4-40 threads, although other threads may be utilized, to result in a non-tapered hole in the finished part as discussed below. The interface 26(2) also includes guide pin holes 41(2) to provide alignment with the guide pins of a standard waveguide flange.

The interface 26(2) also includes interface guide pins 122 located on a rear surface of the interface 26(2) that provide alignment between the interface 26(2) and a waveguide flange, although the interface 26(2) may have other devices in other locations to facilitate alignment between the interface 26(2) and a standard waveguide flange. In this example, the interface guide pins 122 have a tapered shape with a draft angle of approximately 2 degrees from a front end 123A to a rear end of the interface guide pins 122 as shown in FIG. 8.

Figure 13:
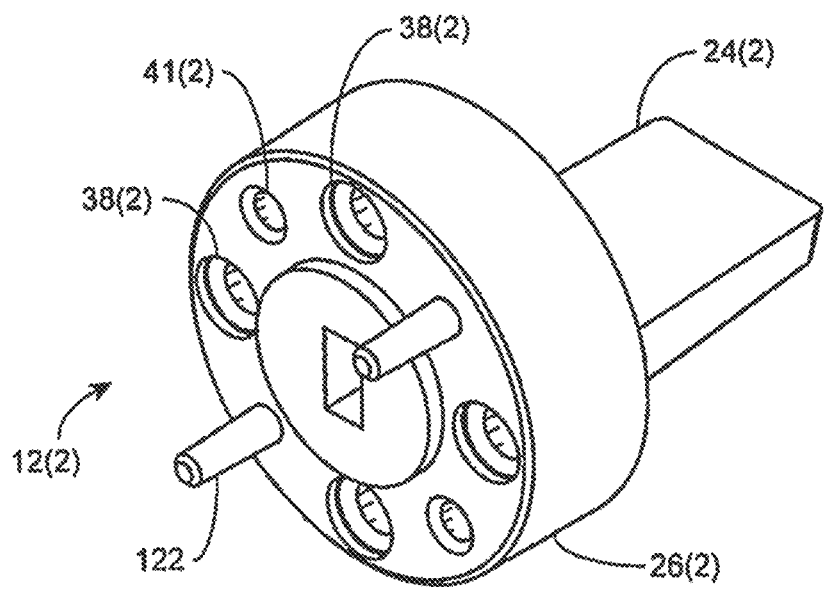
FIG. 13 is a perspective view of the exemplary waveguide interface shown in FIG. 7 after machining processes to finalize the waveguide interface.
Figure 14:
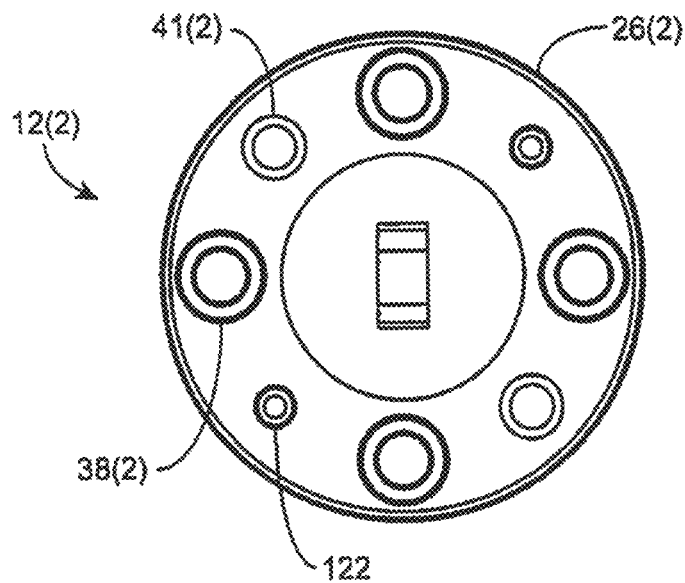
FIG. 14 is a rear view of the exemplary waveguide interface illustrated in FIG. 13.

Referring now to FIGS. 13 and 14, the interface holes 38(2) and guide pin holes 41(2) are machined after the molding process to finalize the waveguide interface 12(2). Specifically, interface holes 38(2) are tapped with an oversized tap so that the interface holes 38(2) are configured to accommodate plating therein. The interface holes 38(2) are further drilled or reamed, by example with a 4-40 thread, in order for the interface holes 38(2) to accommodate screws for connecting the interface 26(2). Further, the guide pin holes 41(2) are reamed to allow for entry of a slip fit dowel pin when coupled to a standard waveguide flange. The waveguide interface 12(2) is further machined to remove all sharp edges resulting from the molding process.

Referring now to FIGS. 15A-15D, top, side, front end, and bottom views of one exemplary printed circuit board assembly 14 are illustrated, respectively. Printed circuit board assembly 14 includes a cut out area 42 configured to receive the communication device 18(1), such that the communication device 18(1) sits within the recessed cut out bottom surface 44 and cut out side surfaces 46A and 46B. Communication device 18(1) is coupled to the printed circuit board assembly 14 using a conductive epoxy adhesive. Various conductive epoxy adhesives are known in the art and are not discussed herein.

The cut out area 42, which includes the cut out bottom surface 44 and cut out side surfaces 46A and 46B, is metallized using standard printed circuit plating techniques. The cut out area 40 is copper and gold plated to maintain a continuous electrical ground plane, although other conductive materials may be utilized. Printed circuit board assembly 14 further includes a top ground plane area 48, a side ground plane area 50, a front ground plane area 52, and a bottom ground plane area 54 that are metallized using standard printed circuit plating techniques, such that the top ground plane area 48, the side ground plane area 50, the front ground plane area 52, and the bottom ground plane area 54 are electrically contiguous. The top ground plane area 48, the side ground plane area 50, the front ground plane area 52, and the bottom ground plane area 54 are copper and gold plated, although other conductive materials may be utilized. The top ground plane area 48 is further electrically contiguous with the cutout side surfaces 46A and 46B and the cut out bottom surface 44 of the cut out area 42. The front ground plane area 52 provides an electrical ground plane in the local interface region of the interface plate 26(1) or interface 26(2) and waveguide flange 22.

Figure 16A:
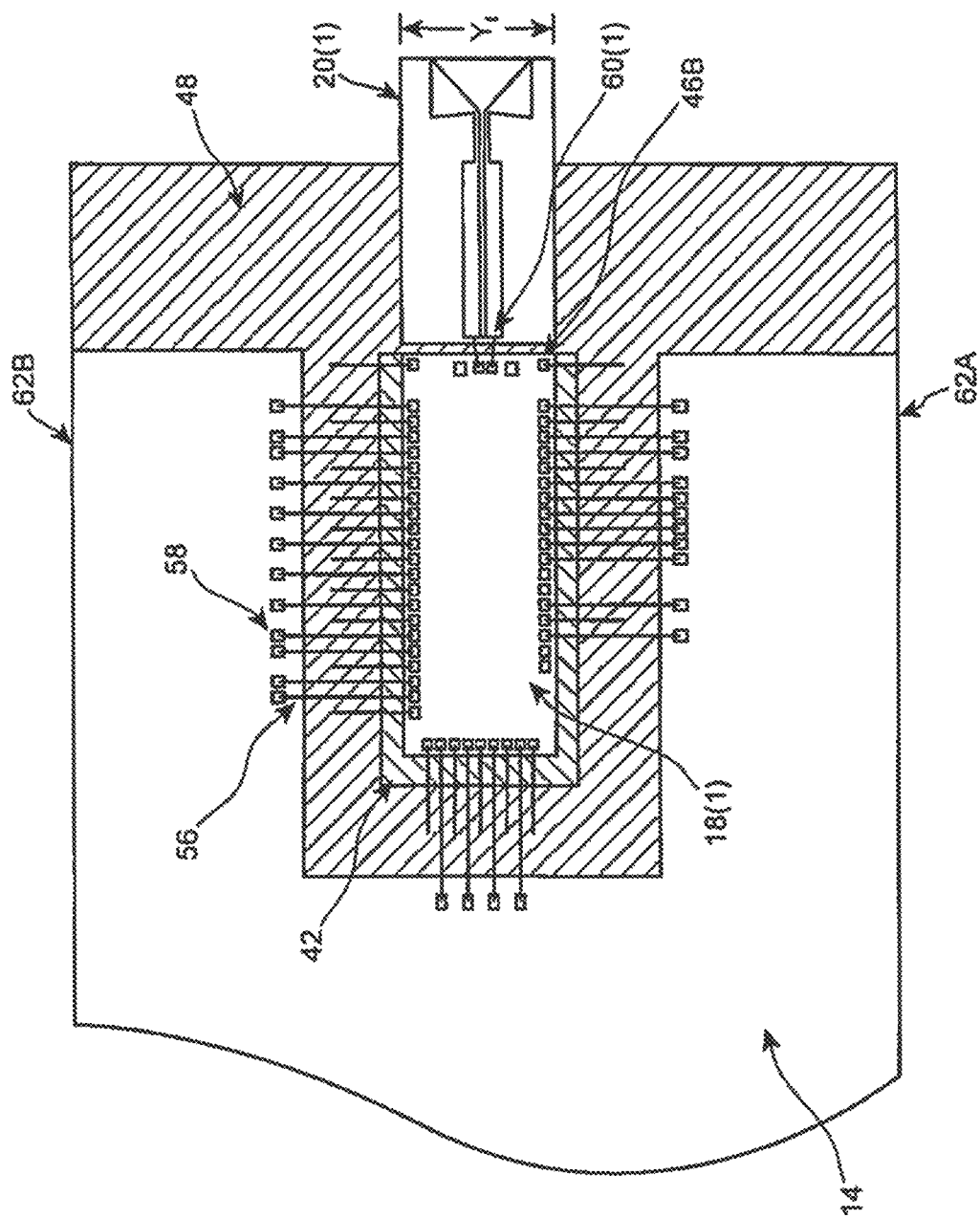
FIG. 16A is a top view of an exemplary transmitter printed circuit board and launch transducer substrate assembly for use with the waveguide interfaces of the present technology.

Referring now to FIG. 16A, a top detailed view of the of the printed circuit board assembly 14 along with communication device 18(1) and launch transducer 20(1), which provide a transmitter printed circuit board assembly, is shown. As shown in FIG. 16A, the communication device 18(1), which is a transmitter communication device, is affixed within the cut out area 42 of the printed circuit assembly 14 and is positioned to abut the cut out area side surface 46B adjacent to the launch transducer 20(1).

Low-frequency signal and power connections are supplied to the communication device 18(1) via a plurality of wire bonds 56 from corresponding wire bond pads 58, although other interconnection technologies besides wire bond pads 58 may be utilized. High-frequency millimeter wave connections are provided between the communication device 18(1) and the adjacently positioned launch transducer 20(1) with low-inductance wire or ribbon bonds 60(1), although other connection technologies may be utilized. The printed circuit assembly 14 includes a width defined by edges 62A and 62B.

Figure 16B:
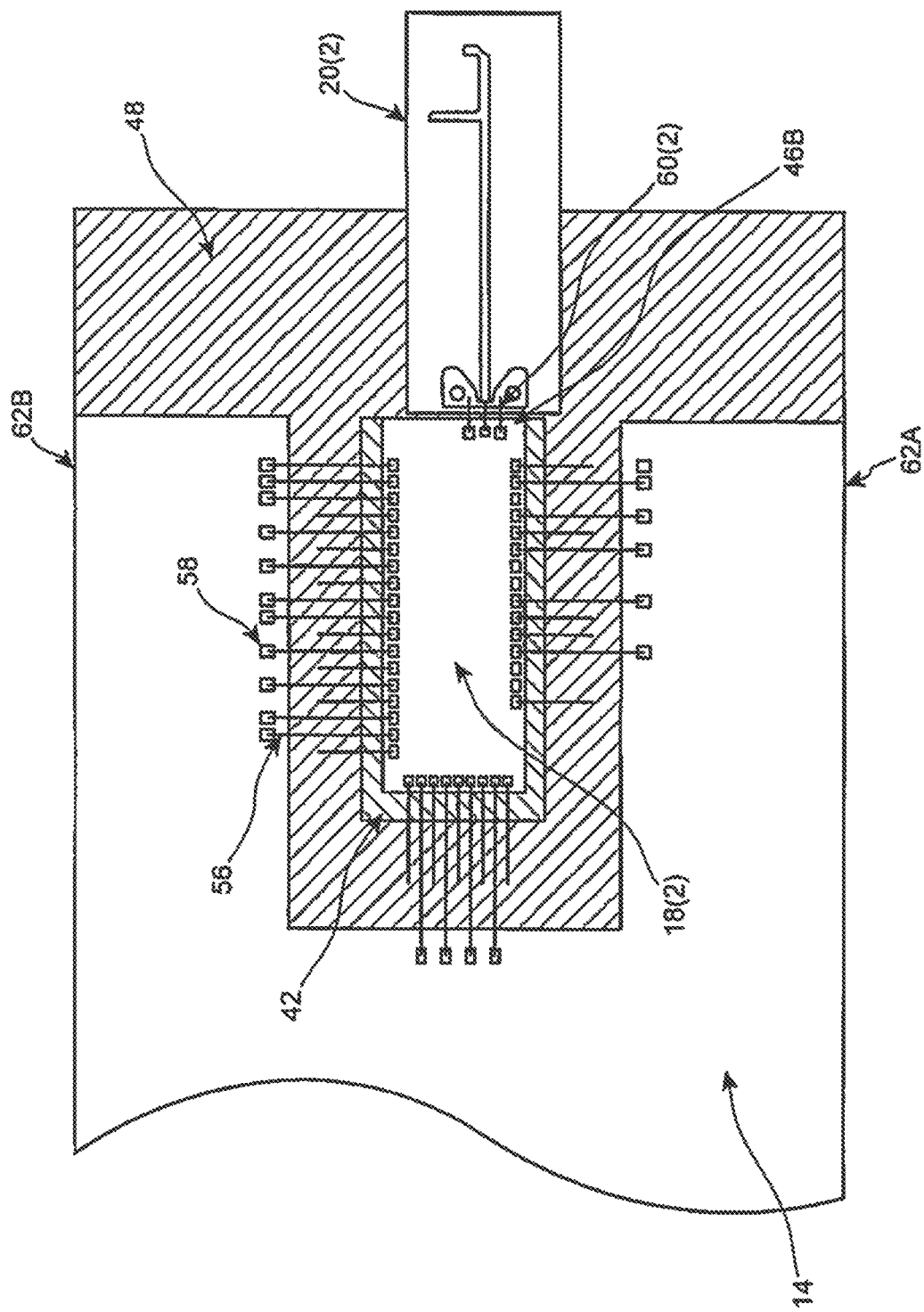
FIG. 16B is a top view of an exemplary receiver printed circuit board and launch transducer substrate assembly for use with the waveguide interfaces of the present technology.

Referring now to FIG. 16B, a top detailed view of the of the printed circuit board assembly 14 along with the communication device 18(2) and launch transducer 20(2), which provide a receiver printed circuit board assembly, is shown. The communication device 18(2), which is a receiver communication device, is affixed within printed circuit assembly cut out area 42 and located to abut the cut out area side surface 46 adjacent to the launch transducer 20(2).

Low-frequency signal and power connections from the printed circuit assembly 14 are provided to the communication device 18(2) via a plurality of wire bonds 56 from corresponding wire bond pads 58, although other interconnection technologies may be utilized. High-frequency millimeter wave connections are communicated between the communication device 18(2) and the launch transducer 20(2) with low-inductance wire or ribbon bonds 60(2), although other connection technologies may be utilized.

Referring again to FIG. 1A, the connector 16 utilized in the waveguide assembly 10 is a multi-pin connector that provides the lower-frequency electrical signals and power connections to the communication device 18(1), although other types of connectors suitable to provide the lower-frequency electrical signals and power connections to the communication device 18(1) may be utilized. The connector 16 is located on the printed circuit assembly 14 at the rear of the waveguide interface 12(1).

The communication device 18(1) is a highly integrated millimeter wave radio transmitter that is attached to the printed circuit assembly 14, although the communication device may alternatively be a highly integrated millimeter wave radio receiver, such as communication device 18(2) shown in FIG. 16B. In one example, the communication device 18(1), 18(2) is a silicon germanium (SiGe) chip, although gallium arsenide (GaAs), complementary metal oxide semiconductor (CMOS), or other semiconductor chips may be utilized for the communication device 18(1), 18(2). The communication device 18(1), 18(2), by way of example only, may be configured to work with a 60 GHz millimeter wave launch transducer 20(1), 20(2). The communication device 18(1) is a balanced output connection at the transmitter output terminal, while communication device 18(2) is an unbalanced input connection to the receiver input terminals. In one example, the communication device 18(1), 18(2) is protected from the environment by a protective cover 64 as shown in FIG. 1A. The protective cover 64 is made of a plastic, although the protective cover 64 may be constructed from other non-conductive materials may be utilized.

Referring again to FIG. 16A, in this example the printed circuit board assembly further includes the launch transducer 20(1), which acts as a transmitter. In one example, the waveguide assembly 10 utilizes a 60 GHz millimeter wave launch transducer 20(1) and enabled communication device 18(1), although the present technology is not limited thereto. Additionally, the launch transducer 20(1) is implemented with matching balanced transmission line terminals to efficiently accept high-frequency energy from the communication device 18(1). Launch transducer 20(1) is located precisely at the midpoint between width edges 62A and 62B of the printed circuit assembly 14. Additionally, the launch transducer 20(1) has a width dimension $Y_t$ that is precisely matched to the opening of the waveguide flange dimension, as discussed below.

Figure 17A:
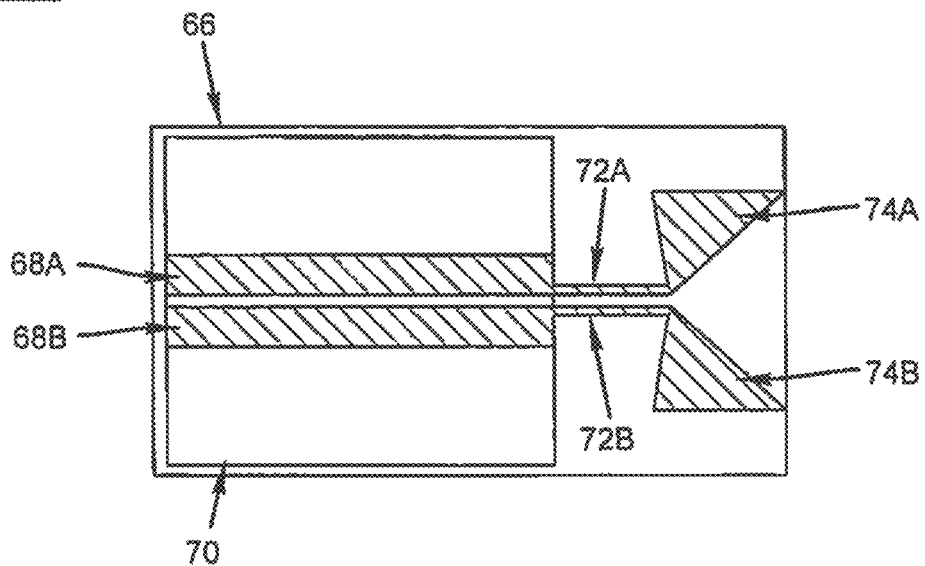
FIGS. 17A and 17B are top and bottom views of an exemplary transmitter launch transducer substrate.
Figure 17B:
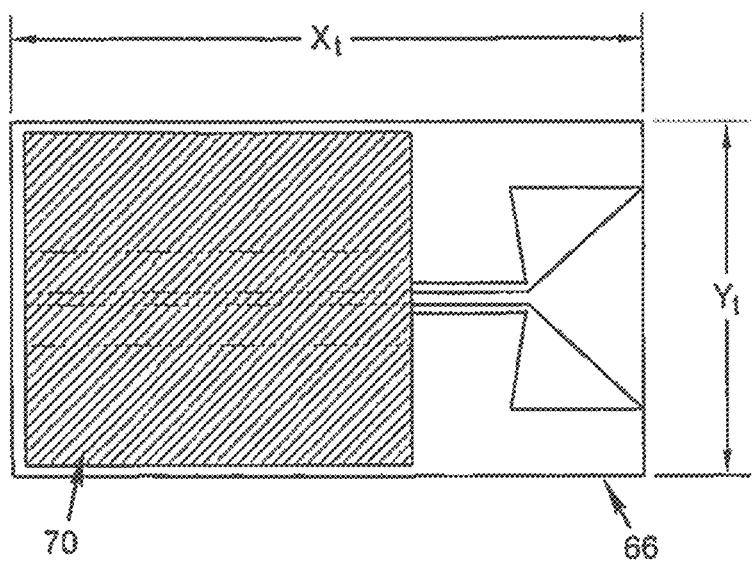

FIGS. 17A and 17B show top and bottom views of the transmitter launch transducer 20(1). As shown in FIG. 17A, the launch transducer 20(1) is composed of low-loss substrate 66 which has a top metallization pattern and bottom metallization pattern. In this example, the low-loss substrate 66 is composed of fused silica (silicon dioxide) and is 254 micrometers (μm) thick, although other low-loss substrate materials and other material thickness values may be utilized. The metallization pattern is substantially composed of vacuum deposited gold metal from vacuum deposition techniques, although other deposition methods may be utilized.

The top metallization pattern of the transmitter launch transducer 20(1) is composed of a first pair of transmission line sections 68A and 68B. The first pair of transmission line sections 68A and 68B are implemented over a ground plane 70 on the bottom side of the low-loss substrate 66. The first pair of transmission line sections 68A and 68B couple energy from the communication device 18(1) via bond wires 60(1), as shown in FIG. 16A, or other means to a second pair of transmission line sections 72A and 72B. The first pair of transmission line sections 68A and 68B are implemented to match the output impedance of the communication device 18(1) and the bond wires 60(1), as shown in FIG. 16A, in a balanced configuration.

The second pair of transmission line sections 72A and 72B are located over a clear substrate section (with no ground plane on the bottom side of the low-loss substrate 66 in this section) and provide energy from the first pair of transmission lines 68A and 68B to a pair of corresponding transducer elements 74A and 74B. The second pair of transmission line sections 72A and 72B are implemented to match the input impedance of the transducer elements 74A and 74B.

Figure 19:
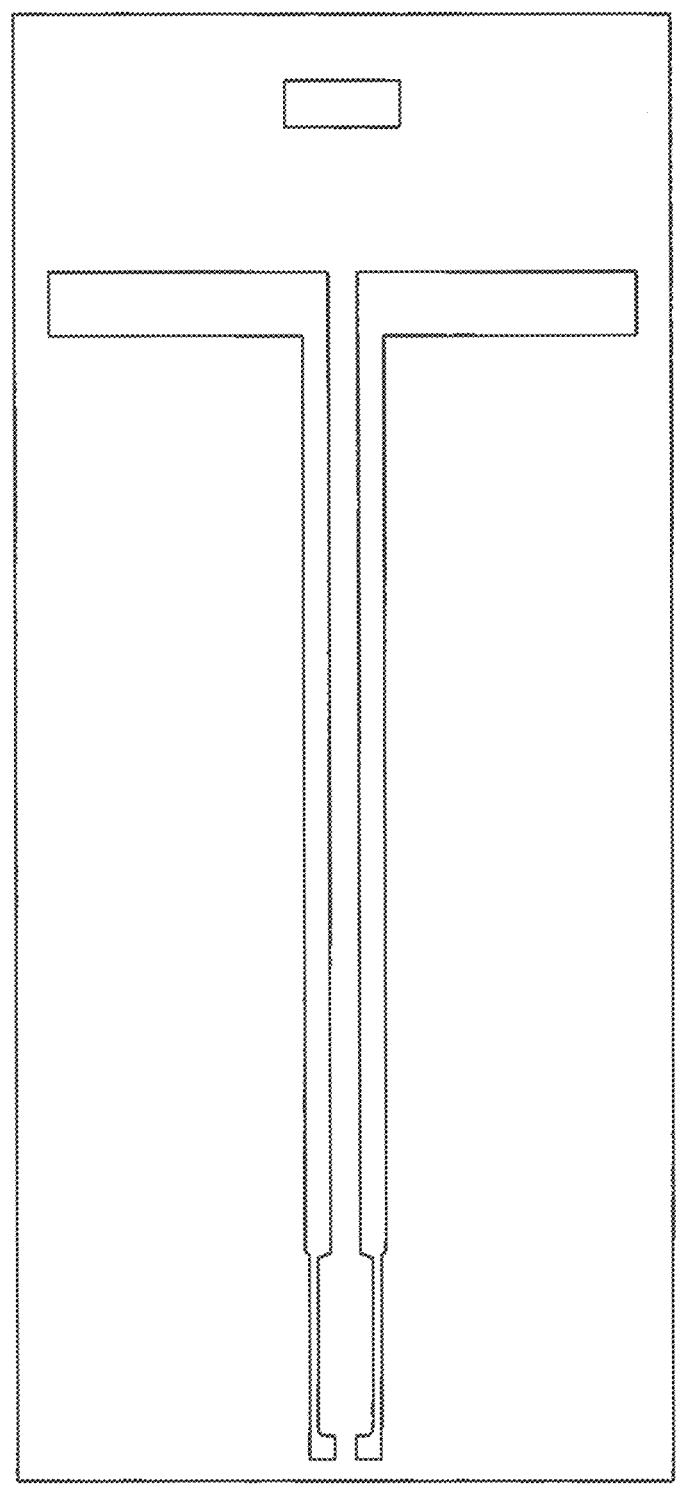
FIG. 19 is a top view of another exemplary launch transducer substrate assembly for use with the waveguide interfaces of the present technology.

The transducer elements 74A and 74B are configured to provide substantial energy propagation in a direction parallel to the low-loss substrate 66 and away from the second pair of transmission line sections 72A and 72B, thereby forming an end-fire propagation pattern into an opening in the waveguide flange opening. The launch transducer 20(1) has a width dimension, $Y_t$, that is matched to be inserted into the standard waveguide flange opening having the "b" dimension described below. In one example, $Y_t$ is 1.80 mm and the value of $X_t$ is 2.87 mm, although other values for these dimensions are contemplated. Although an exemplary configuration for the launch transducer 20(1) is illustrated and described, alternative configurations may be utilized. By way of example, in another embodiment, launch transducer 20(1) may include a variation of a dipole with a parasitic element as illustrated in FIG. 19.

Referring again FIG. 16B, in another example the printed circuit board assembly 14 includes the launch transducer 20(2), which acts as a receiver. In one example, the waveguide assembly 10 utilizes a 60 GHz millimeter wave launch transducer 20(2) and enabled communication device 18(2), although the present technology is not limited thereto. The launch transducer 20(2) is implemented with matching unbalanced transmission line terminals to efficiently deliver high-frequency energy to the communication device 18(2). The launch transducer 20(2) is located precisely at the midpoint between printed circuit assembly 14 width edges 62A and 62B The launch transducer 20(2) has a width that is precisely matched to the to the opening of the waveguide flange dimension, as discussed below.

Figure 18A:
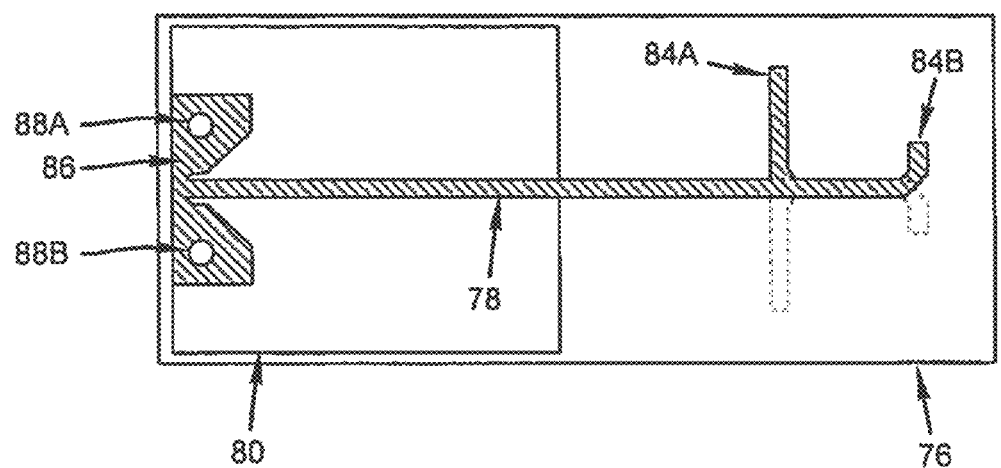
FIGS. 18A and 18B are top and bottom views of an exemplary receiver launch transducer substrate.
Figure 18B:
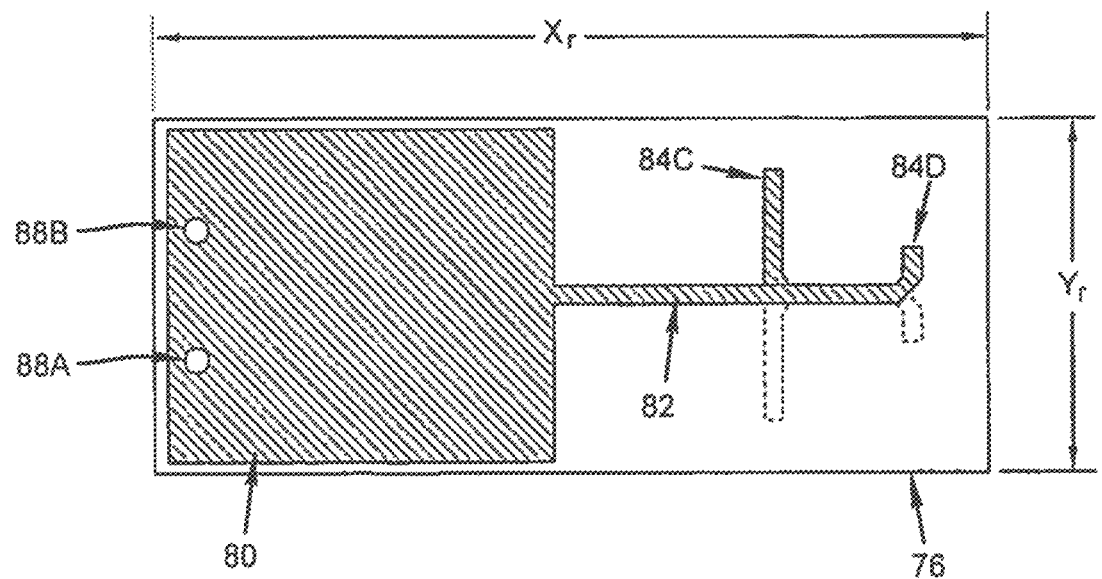

FIGS. 18A and 18B show top and bottom views of a receiver launch transducer 20(2). The launch transducer 20(2) is composed of a low-loss substrate 76 which has a top metallization pattern and bottom metallization pattern. In this example, the substrate 76 is composed of alumina (aluminum oxide) and is 127 micrometers (μm) thick, although other low-loss substrate materials and other material thickness values may be utilized. The metallization pattern is substantially composed of vacuum deposited gold metal using vacuum deposition techniques or other appropriate methods.

In this example, the top metallization pattern includes a transmission line center conductor 78 that traverses a length over a ground plane 80, which is located on the bottom side of the low-loss substrate 76. Beyond the position of ground plane 80, the transmission line center conductor 78 continues and is positioned over a bottom side transmission line 82. The transmission line center conductor 78 and the bottom side transmission line 82 together are coupled to transducer elements 84A, 84B, 84C, and 84D. The transducer elements 84A and 84B and 84C and 84D, respectively, form dual element dipoles and are configured to provide a directional propagation pattern in a direction parallel to the low-loss substrate 76 and away from the transmission line center conductor 78 and the bottom side transmission line 82, thereby forming an end-fire propagation pattern into a waveguide flange opening, as discussed below.

The unbalanced input circuit configuration is composed of a ground connection 86 and the transmission line center conductor 78. The ground connection 86 is electrically connected through the low-loss substrate 76 and facilitated by metalized plating through holes (also known as vias) 88A and 88B, thereby forming a low-inductance connection to the ground plane 80 on the bottom side of the low-loss substrate 76. In one example, the diameter of via holes 88A and 88B is 127 micrometers ($\mu$m) with gold metallization formed on the inner walls, although other dimensions and material selections are contemplated.

Figure 21C:
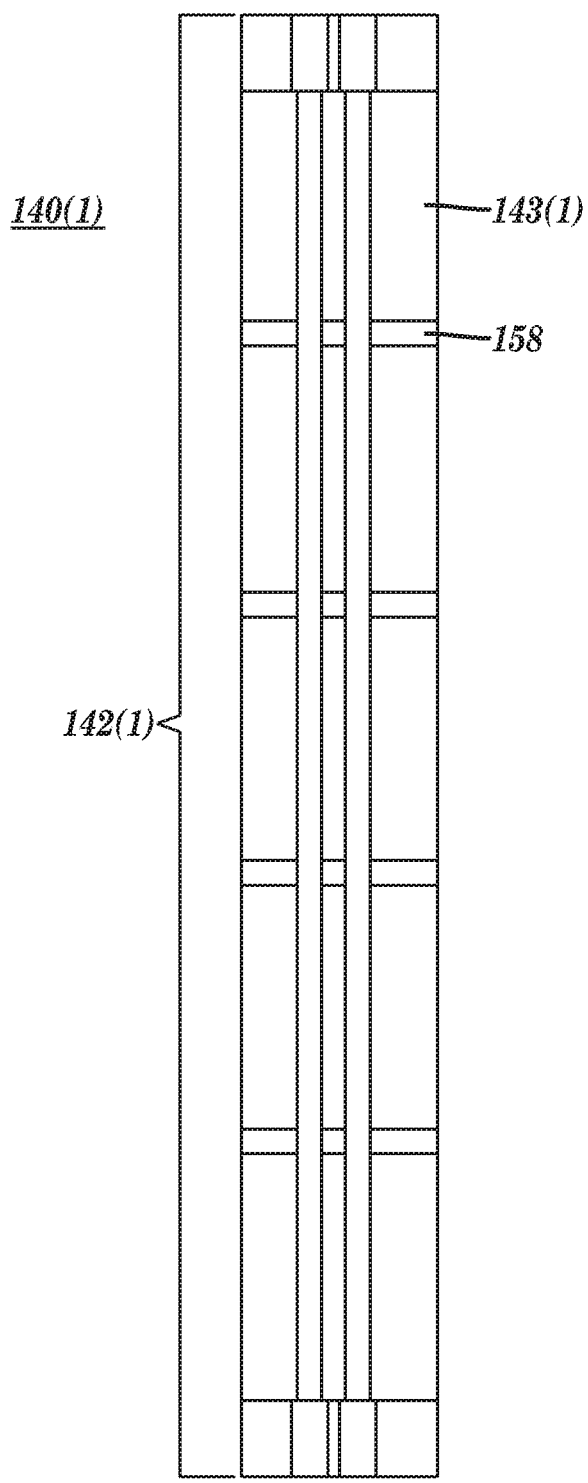
Figure 22:
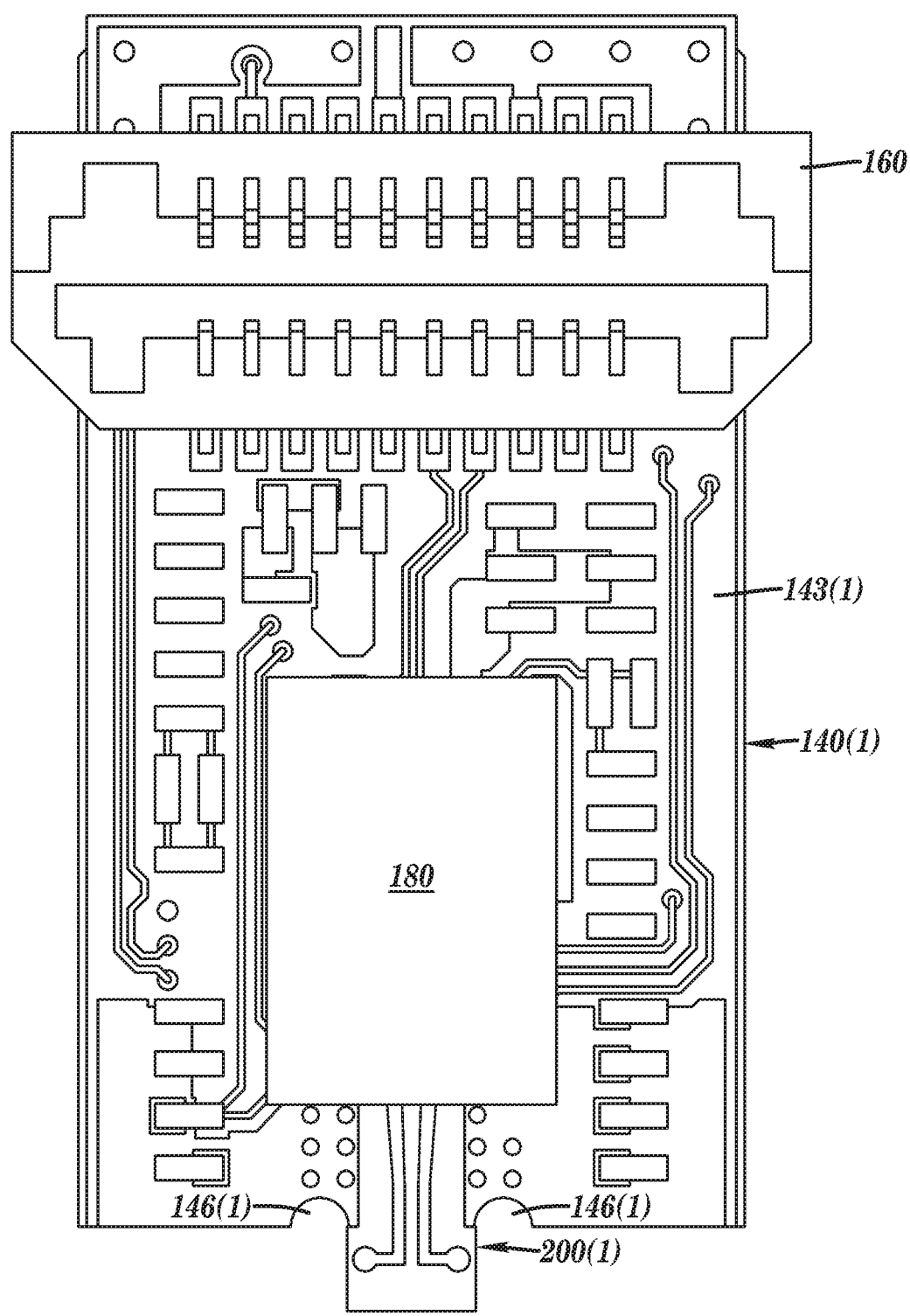
FIG. 22 is a top view of the exemplary printed circuit board shown in FIG. 20 with an attached communication device.

Referring now to FIGS. 20-24C, exemplary printed circuit board assemblies 140(1) and 140(2) are shown. The printed circuit board assemblies 140(1) and 140(2) may be utilized with any of the examples of the waveguide interfaces 12(1) and 12(2) of the waveguide assembly 10 as described above. The printed circuit board assemblies 140(1) and 140(2) include integrated launch transducer elements 200(1) and 200(2), respectively, which are printed or etched on a top layer of the printed circuit board assemblies 140(1) and 140(2) as described in further detail below. This configuration provides efficient launch transducer elements that may be coupled into a waveguide interface while being compatible with surface mount technologies for mounting the communication device 180 as shown in FIG. 22. The communication device 180 may be a transmitter or receiver communication device in accordance with the launch transducer element 200(1) or 200(2) utilized as described below.

Figures 24A, 24B:
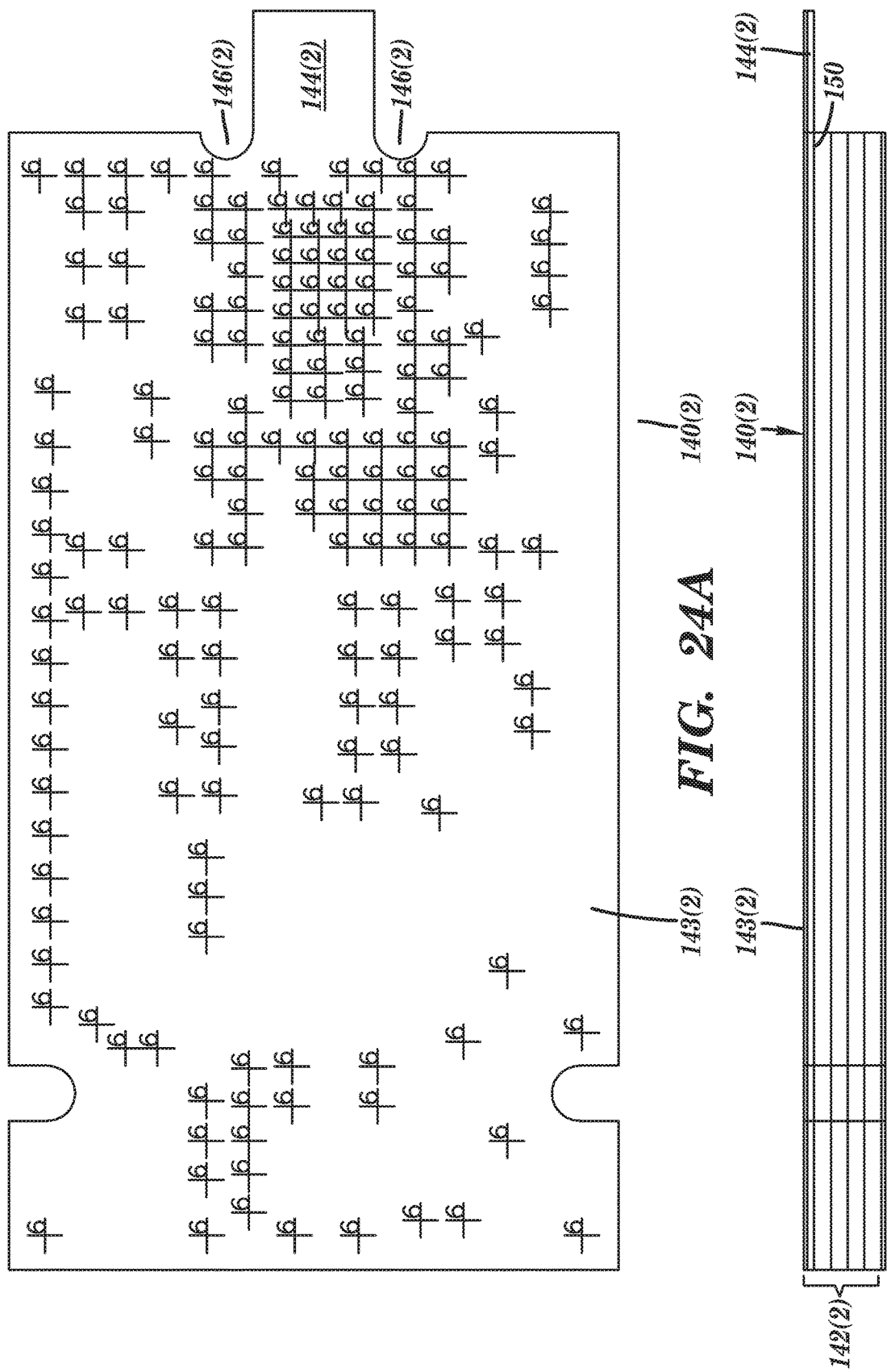
FIGS. 24A-24C are top, side cross-sectional, and end cross-sectional views of the fabrication of the exemplary printed circuit board illustrated in FIG. 23.
Figure 24C:
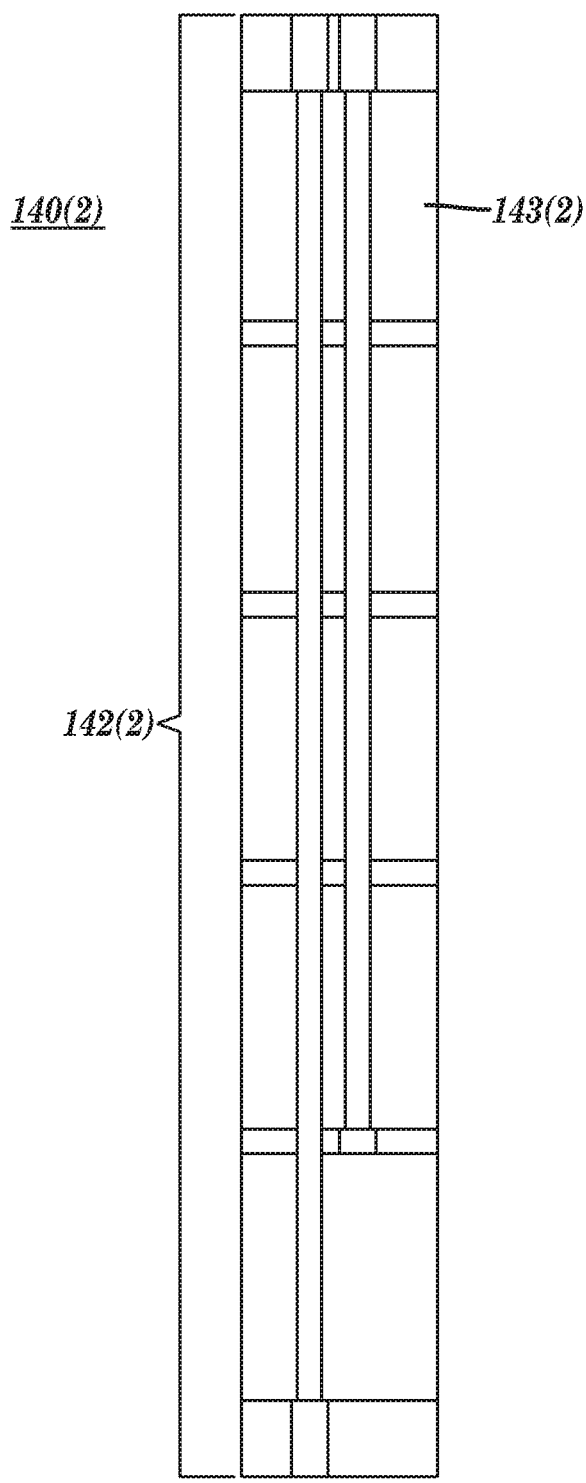

Referring now more specifically to FIGS. 21A-21C and FIGS. 24A-24C, the printed circuit board assemblies 140(1) and 140(2) each are fabricated from a plurality of laminated layers 142(1) and 142(2), respectively. Each of the printed circuit board assemblies 140(1) and 140(2) includes a top layer 143(1) and 143(2), respectively, formed of a low-loss, high-frequency laminate dielectric, such as Rogers 4350B by way of example only, although other low-loss, high-frequency laminate dielectrics may be utilized. The term top layer is used only to denote the layer upon which the communication device 180 will be surface mounted. A conductive layer, or conductive elements, may be applied to the top layers 143(1) and 143(2) as shown in FIGS. 21C and 24C and described further below. Additional dielectric layers below the top layers 143(1) and 143(2) may be formed from standard, low-frequency laminate dielectrics such as Isola 370-HR, by way of example. The plurality of layers 140(1) and 140(2) also include a number of additional conductive signal, power plane, and ground plane, layers formed of, by way of example only copper, although other conductive materials may be utilized. All of the conductive layers are formed using standard printed circuit plating and etching techniques.

The top layers 143(1) and 143(2) each include an extended portion 144(1) and 144(2), respectively, formed by milling and undercutting the additional layers in the plurality of layers 140(1) and 140(2). The extended portions 144(1) and 144(2) are configured to be located in the waveguide segment 36 of the waveguide interface 26(2), as shown in FIG. 11, when the printed circuit board assembly 140(1) or 140(2) is located on the support block 24(2). Cutouts 146(1) and 146(2) are formed as part of the milling process and are necessary to form the extended portions 144(1) and 144(2). The cutouts 146(1) and 146(2) do not significantly impact performance.

Figure 20:
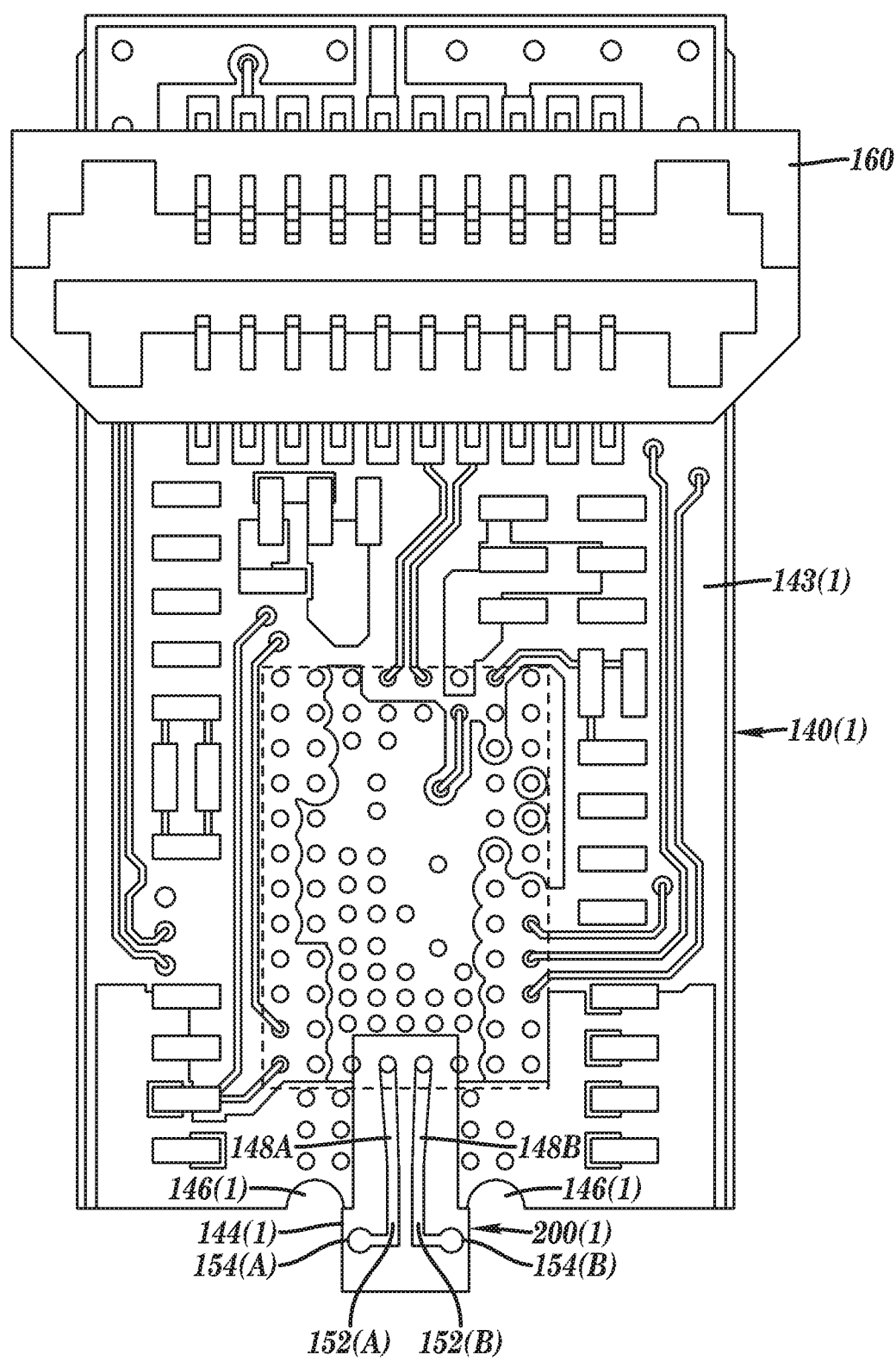
FIG. 20 is a top view of another exemplary printed circuit board with an integrated transmitter launch transducer for use with the exemplary waveguide interfaces of the present technology.

Referring now more specifically to FIG. 20, in this example the printed circuit board assembly 140(1) includes the launch transducer element 200(1), which acts as a transmitter. The launch transducer element 200(1) is formed by printing or etching conductive material, such as copper by way of example, on the low-loss, high frequency dielectric top layer 143(1). In this example, the dielectric top layer 143(1) is approximately 0.0066 inches (6.6 mils) thick and the printed or etched conductive layer is approximately 0.0022 inches (2.2 mils) thick. In one example, the launch transducer element 200(1) is at least a 60 GHz millimeter wave launch transducer, although the present technology is not limited thereto.

The launch transducer element 200(1) includes matching balanced transmission line terminals that may be coupled to and efficiently accept high-frequency energy from the communication device 180 based on a coupling as shown in FIG. 22. In this example, the launch transducer element 200(1) is located precisely at the midpoint between the width edges of the printed circuit assembly 140(1). Additionally in this example, the launch transducer element 200(1) has a width dimension $Y_t$ that is precisely matched to the opening of the waveguide flange dimension, as discussed above with respect to FIG. 16A.

The top layer 143(1) provides a low-loss substrate for the launch transducer element 200(1), which has a top metallization pattern and a bottom metallization pattern. The top metallization pattern of the launch transducer element 200 (1) comprises a first pair of transmission line sections 148A and 148B. The first pair of transmission line sections 148A and 148B are implemented over a ground plane 158 as shown in FIG. 21B on the bottom side of the top dielectric layer 143(1). The first pair of transmission line sections 148A and 148B couple energy from the communication device 180 to a second pair of transmission line sections 152A and 152B. The first pair of transmission line sections 148A and 148B are implemented to match the output impedance of the communication device 180 in a balanced configuration.

The second pair of transmission line sections 152A and 152B are located over the extended portion 144(1) of the top layer 143(1), which provides a clear substrate section (with no ground plane on the bottom side of the low-loss top layer 143(1) in this section as shown in FIG. 21B) and provide energy from the first pair of transmission lines 148A and 148B to a pair of corresponding transducer elements 154A and 154B. The second pair of transmission line sections 152A and 152B are implemented to match the input impedance of the transducer elements 154A and 1544B.

The transducer elements 154A and 154B are configured to provide substantial energy propagation in a direction parallel to the low-loss dielectric top layer 143(1) and away from the second pair of transmission line sections 152A and 152B, thereby forming an end-fire propagation pattern into an opening in the waveguide flange opening. The launch transducer element 200(1) has a width dimension, $Y_f$, that is matched to be inserted into the standard waveguide flange opening having the "b" dimension described above with respect to FIG. 16A. Although an exemplary configuration for the launch transducer element 200(1) is illustrated and described, alternative configurations may be formed using other metallization patterns on the top layer 140(1). By way of example, in another embodiment, the launch transducer element 200(1) may include a variation of a dipole with a parasitic element as illustrated in FIG. 19.

Figure 23:
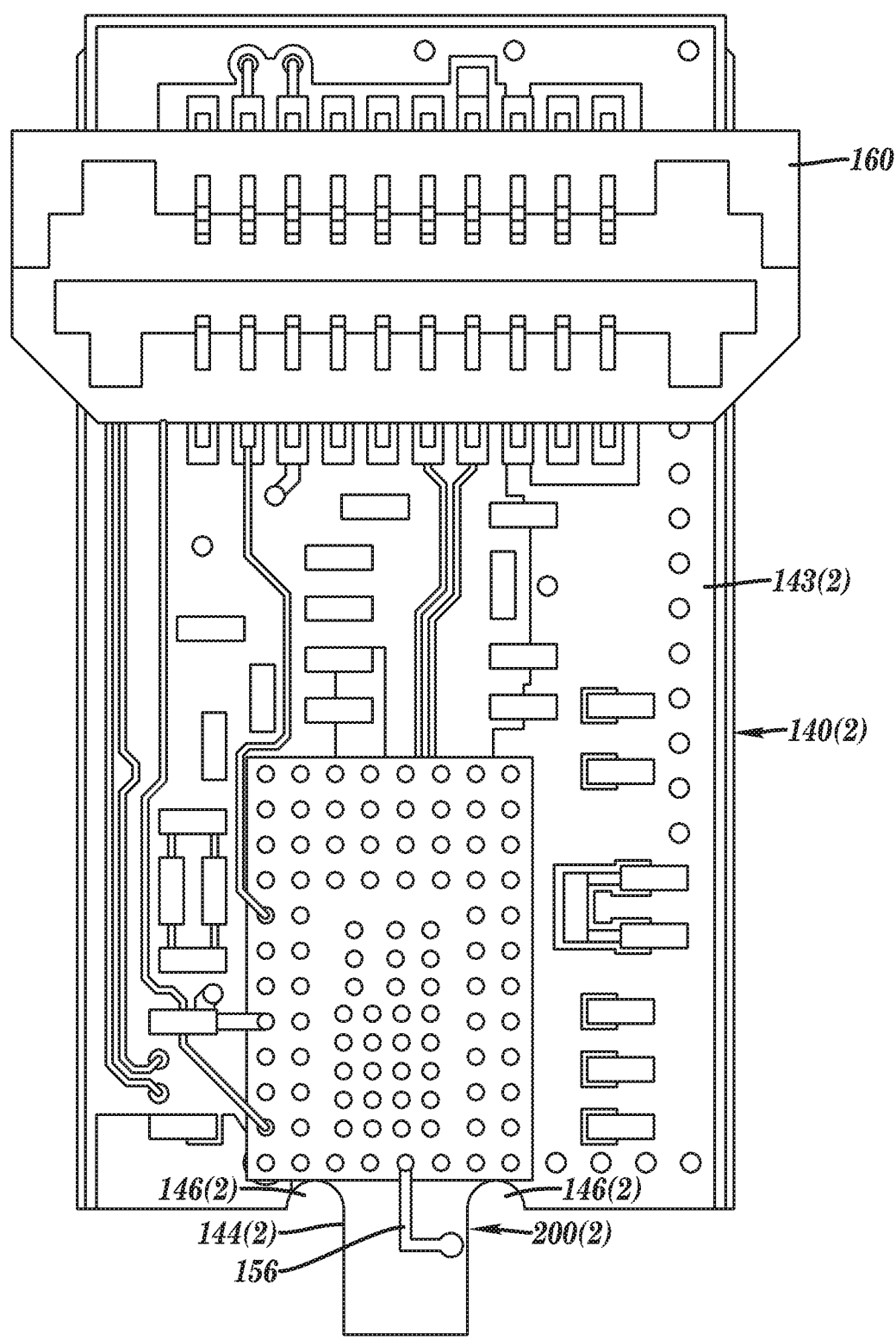
FIG. 23 is a top view of another exemplary printed circuit board with an integrated receiver launch transducer for use with the exemplary waveguide interfaces of the present technology.

Referring now more specifically to FIG. 23, in this example the printed circuit board assembly 140(2) includes the launch transducer element 200(2), which acts as a receiver. The launch transducer element 200(2) is formed by printing or etching conductive material, such as copper by way of example, on the low-loss, high frequency dielectric top layer 143(2). In this example, the dielectric top layer 143(2) is approximately 0.004 inches (4.0 mils) thick and the printed or etched conductive layer is approximately 0.0022 inches (2.2 mils) thick. In one example, the launch transducer element 200(2) is at least a 60 GHz millimeter wave launch transducer, although the present technology is not limited thereto.

The launch transducer element 200(2) is implemented with matching unbalanced transmission line terminals to efficiently deliver high-frequency energy to the communication device 180, by way of example only. The launch transducer element 200(2) is located precisely at the midpoint between the width edges of the printed circuit assembly 140(2). The launch transducer 200(2) has a width that is precisely matched to the opening of the waveguide flange dimension, as discussed above with respect to FIG. 16B.

The top layer 143(2) provides a low-loss substrate for the launch transducer element 200(2), which has a top metallization pattern and a bottom metallization pattern. In this example, the top metallization pattern, which is printed or etched onto the top layer 143(2) using a conductive material, includes a transmission line center conductor 156 that traverses a length over a ground plane 158 as shown in FIG. 24B, which is located on the bottom side of the low-loss top layer 143(2). Beyond the position of the ground plane 158, the transmission line center conductor 156 continues and is positioned over a bottom side transmission line (not shown). The transmission line center conductor 156 and the bottom side transmission line together are coupled to transducer elements that form a dual element dipole that is configured to provide a directional propagation pattern in a direction parallel to the low-loss top layer 143(2) of the printed circuit board assembly 140(2) and away from the transmission line center conductor 156 and the bottom side transmission line, thereby forming an end-fire propagation pattern into a waveguide flange opening, as discussed below.

The unbalanced input circuit configuration is composed of a ground connection and the transmission line center conductor 156. The ground connection is electrically connected from the communication device 180, which acts as a receiver, through the low-loss top layer 143(2) and facilitated by metalized plating through holes (also known as vias), thereby forming a low-inductance connection to the ground plane 158 on the bottom side of the low-loss top layer 143(2).

Referring now to FIG. 22, the communication device 180 can be surface mounted directly on the printed circuit board assembly 140(1). Although the communication device 180 is shown in relation to printed circuit board assembly 140(1), which acts as a transmitter, a communication device could be applied to printed circuit board assembly 140(2), which acts as a receiver, in the same manner. Referring again to FIG. 22, in this example the communication device 180 is a transmitter communication device that is surface mounted on the printed circuit board assembly 140(1) adjacent the launch transducer element 200(1). Connections to the communication device 180 are provided based on the metallization pattern located on the printed circuit board assembly 140(1) as shown in FIG. 20.

Referring again to FIG. 22, in this example the communication device 180 is a highly integrated millimeter wave radio transmitter that is surface mounted to the printed circuit assembly 140(1) using wafer level chip scale packaging techniques, although a highly integrated millimeter wave radio receiver may be used in other examples. In one example, the communication device 180 contains a silicon germanium (SiGe) chip, although gallium arsenide (GaAs), complementary metal oxide semiconductor (CMOS), or other semiconductor chips may be utilized for the communication device 180. The communication device 180, by way of example only, may be configured to work with a 60 GHz millimeter wave launch transducer element 200(1).

Printed circuit board assembly 140(1) further includes a connector 160 that is a multi-pin connector that provides the lower-frequency electrical signals and power connections to the communication device 180, although other types of connectors suitable to provide the lower-frequency electrical signals and power connections to the communication device 180 may be utilized. The connector 160 is located on the printed circuit assembly 140(1) and is located at the rear of the waveguide interface when assembled, as shown in FIG. 22. The connector 160 is coupled to the printed circuit board assembly 140(1) through the metallization pattern formed on the dielectric top layer 143(1).

FIGS. 25A-28B illustrate exemplary printed circuit boards 140(3)-140(6) of the present technology formed in different body configurations, which may be applied in different applications. By way of example only, the printed circuit board assemblies 140(3) and 140(4), as shown in FIGS. 25A-26B, provide a narrower body configuration, while exemplary printed circuit board assemblies 140(5) and 140(6), as shown in FIGS. 27A-28B, provide a wider body configuration, as described in further detail below.

Referring now more specifically to FIGS. 25A-26B, the printed circuit board assemblies 140(3) and 140(4) include integrated launch transducer elements 200(3) and 200(4), respectively, which are printed or etched on a top layer of the printed circuit board assemblies 140(3) and 140(4) as described in further herein. In this example, the printed circuit board assemblies 140(3) and 140(4) have a narrow body configuration having a dimension parallel to the extension of the launch transducer elements 200(3) and 200(4) that is greater than a dimension perpendicular to the extension of the launch transducer element 200(3) and 200(4).

Referring now more specifically to FIGS. 27A-28B, the printed circuit board assemblies 140(5) and 140(6) include integrated launch transducer elements 200(5) and 200(6), respectively, which are printed or etched on a top layer of the printed circuit board assemblies 140(5) and 140(6) as described in further detail herein. The launch transducer element 200(5) acts as a transmitter, while the launch transducer element 200(6) provides a receiver. In this example, the printed circuit board assemblies 140(5) and 140(6) have a wide body configuration having a dimension parallel to the extension of the launch transducer elements 200(5) and 200(6) that is less than a dimension perpendicular to the extension of the launch transducer element 200(5) and 200(6).

Referring again to FIGS. 25A-28D, the exemplary printed circuit board assemblies 140(3)-140(6) are formed in the same manner as exemplary printed circuit board assemblies 140(1) and 140(2), although printed circuit board assemblies with the body configurations discussed below could be formed in other manners using other techniques. In this example, the printed circuit board assemblies 140(3)-140(6) each are fabricated from a plurality of laminated layers as described above with respect to the printed circuit boards 140(1) and 140(2). The exemplary printed circuit board assemblies 140(3)-140(6) have the same structure and configuration as exemplary printed circuit boards 140(1) and 140(2) except as described below.

Referring again to FIGS. 25A-28B, each of the printed circuit board assemblies 140(3)-140(6) includes a top layer 143(3)-143(6), respectively, formed of a low-loss, high-frequency laminate dielectric, such as the laminate dielectric Rogers 4350B made by Rogers Corp., Rogers, Conn., by way of example only, although other low-loss, high-frequency laminate dielectrics may be utilized. The term top layer is used only to denote the layer upon which the communication device 180, or other additional communication devices 280(1)-280(n) in some examples, will be surface mounted. A conductive layer, or conductive elements, may be applied to the top layers 143(3)-143(6) as described further below. Additional dielectric layers below the top layers 143(3)-143(6) may be formed from standard, low-frequency laminate dielectrics such as Isola 370-HR, by way of example. The plurality of layers of the printed circuit boards 140(3)-140(6) also include a number of additional conductive signal, power plane, and ground plane, layers formed of, by way of example only copper, although other conductive materials may be utilized. All of the conductive layers are formed using standard printed circuit plating techniques.

The top layers 143(3)-143(6) each include an extended portion 144(3)-144(6), respectively, formed by milling and undercutting the additional layers in the plurality of layers. The extended portions 144(1)-144(6) are configured to be located in the waveguide segment 36 of the waveguide interface 26(2), as shown in FIG. 11, when the printed circuit board assembly 140(3)-140(6) is located on the support block 24(2). Cutouts 146(3)-146(6) are formed as part of the milling process and are necessary to for the extended portions 144(3)-144(6). The cutouts 146(3)-146(6) do not significantly impact performance.

Figure 25A:
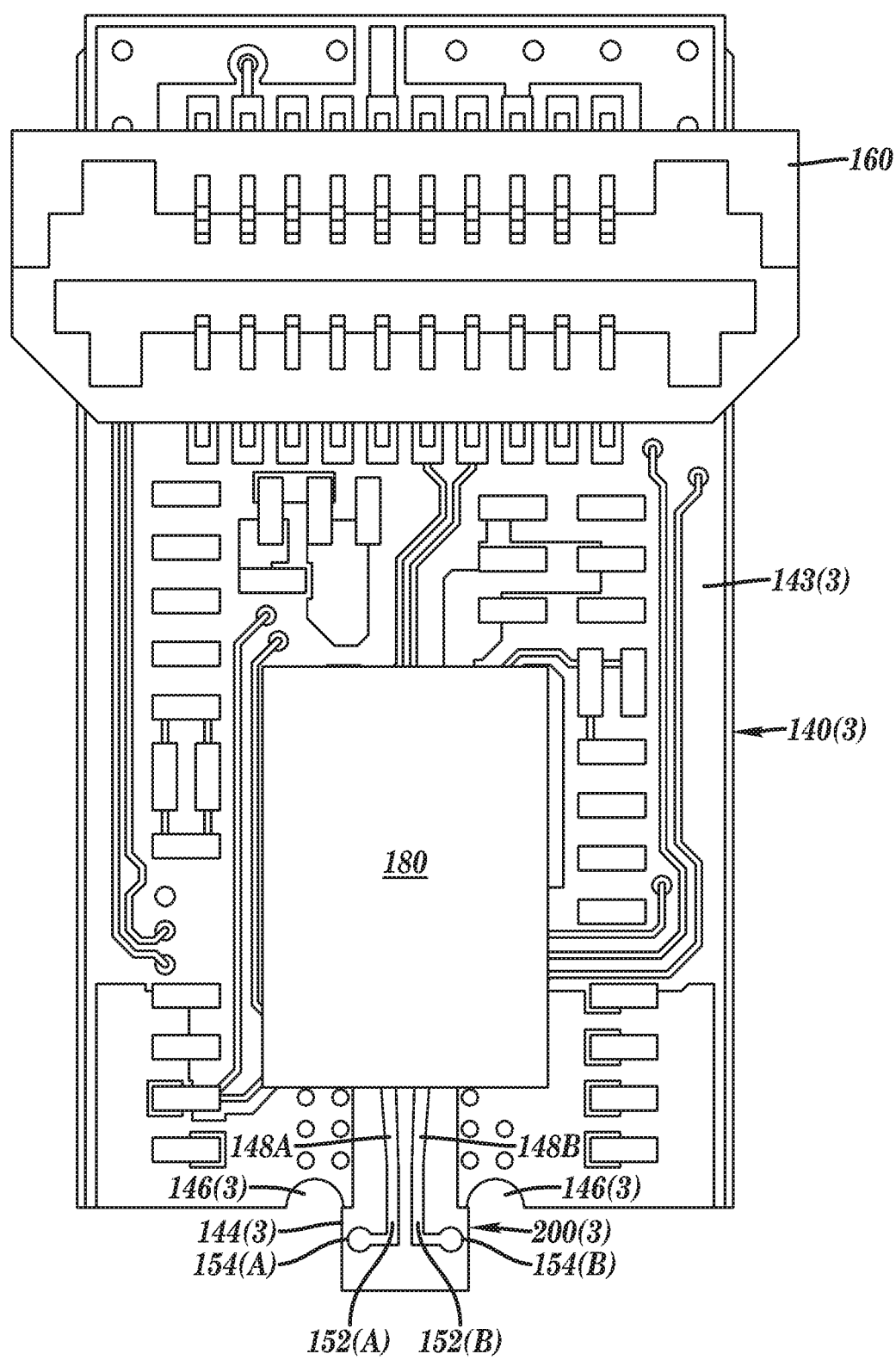
FIGS. 25A and 25B are top and bottom views of an exemplary printed circuit board assembly with an integrated transmitter launch transducer and having a narrow body configuration for use with the exemplary waveguide interfaces of the present technology.
Figure 25B:
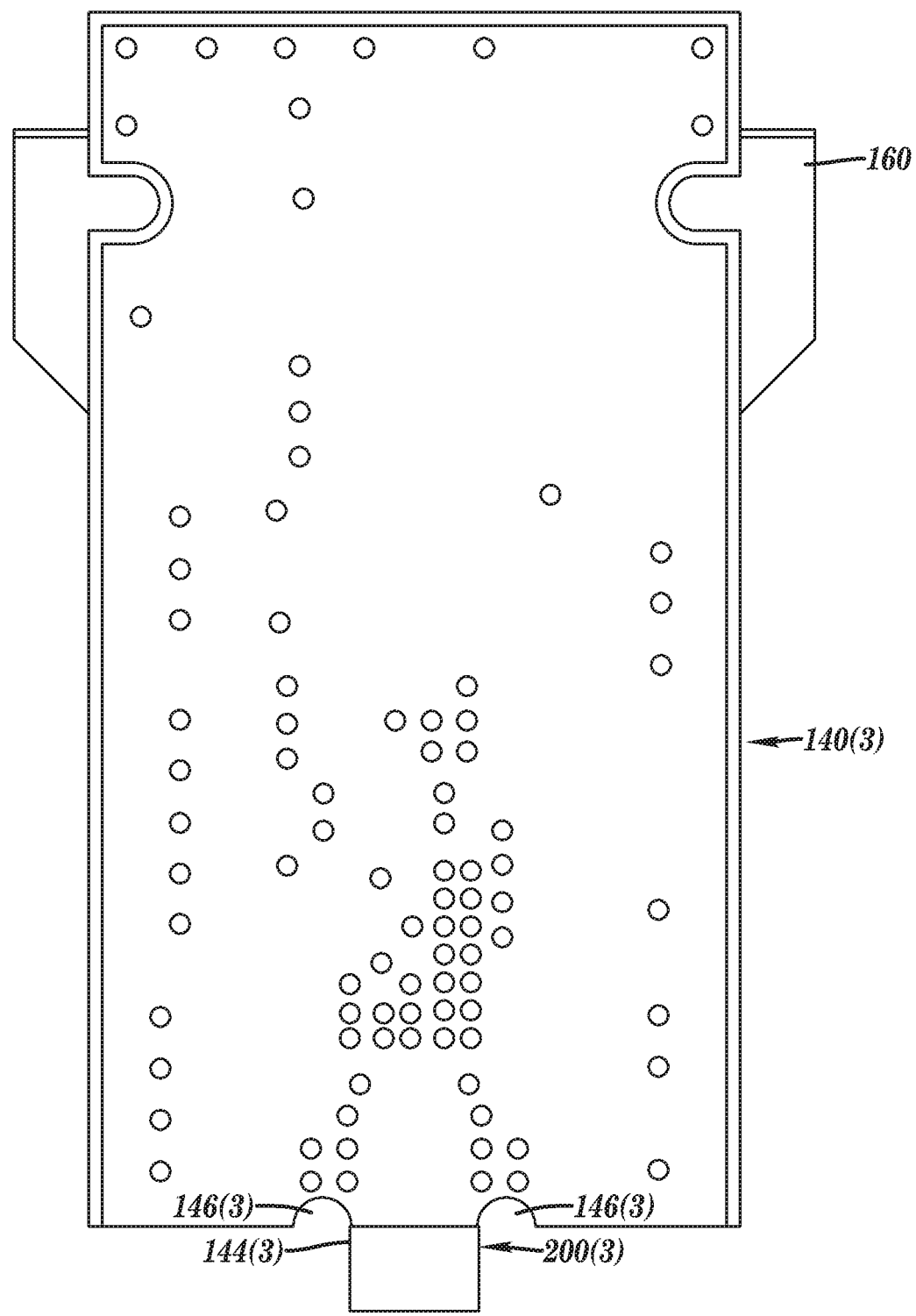
Figure 27B:
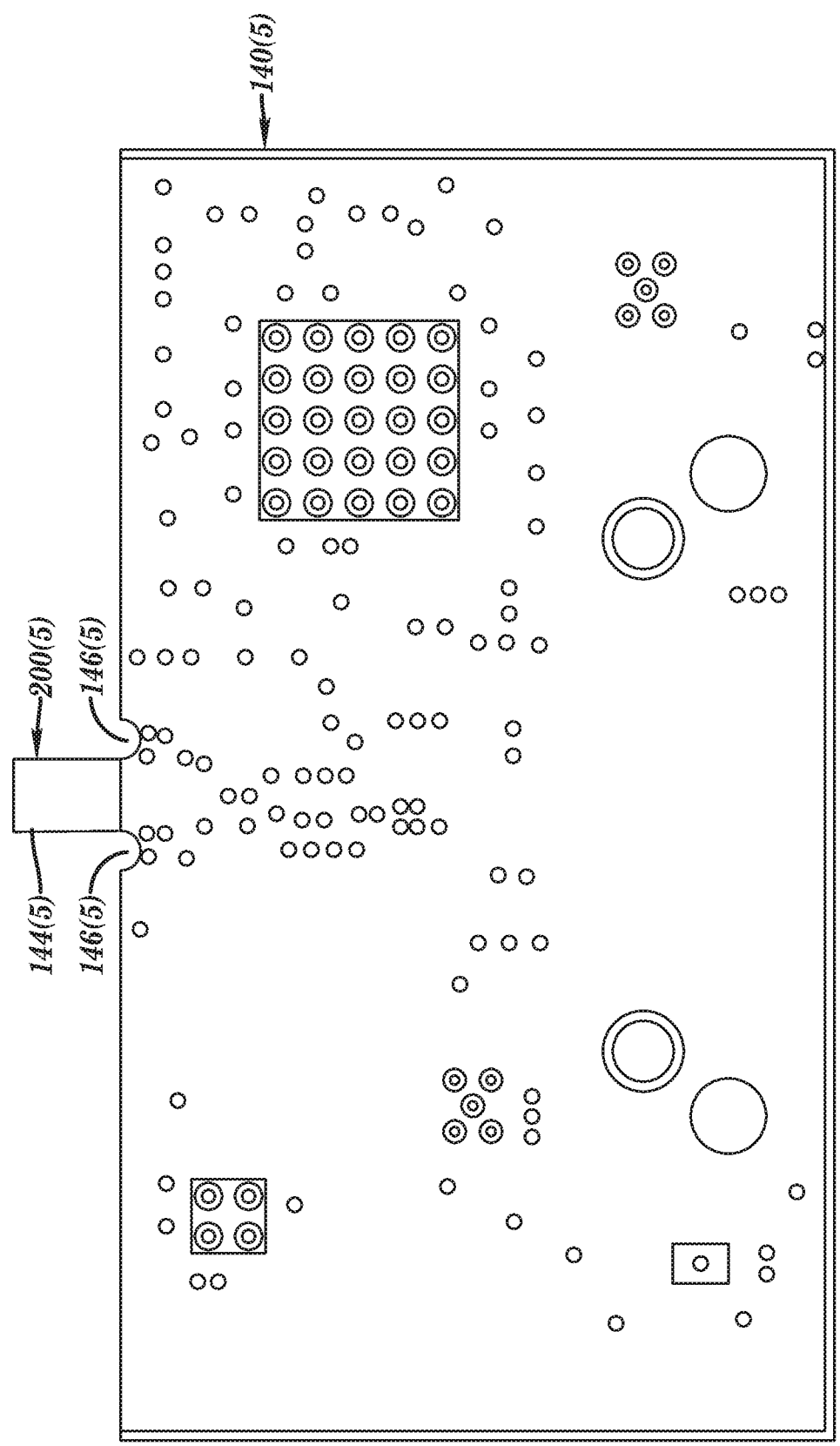

Referring now more specifically to FIGS. 25A and 27A, in these examples the printed circuit board assemblies 140(3), 140(5) include the launch transducer elements 200(3), 200(5), which acts as a transmitter. The launch transducer elements 200(3), 200(5) are formed by printing or etching conductive material, such as copper by way of example, on the low-loss, high frequency dielectric top layers 143(3), 143(5). In this example, the dielectric top layers 143(3), 143(5) are approximately 0.0066 inches (6.6 mils) thick and the printed or etched conductive layers are approximately 0.0022 inches (2.2 mils) thick. In one example, the launch transducer elements 200(3), 200(5) are at least 60 GHz millimeter wave launch transducers, although the present technology is not limited thereto.

The launch transducer elements 200(3), and 200(5) include matching balanced transmission line terminals that may be coupled to and efficiently accept high-frequency energy from the communication device 180 based on a coupling as shown in FIGS. 25A and 27A. In this example, the launch transducer elements 200(3), 200(5) are located precisely at the midpoint between the width edges of the printed circuit assemblies 140(3), 140(5). Additionally in this example, the launch transducer elements 200(3), 200(5) have a width dimension $Y_t$ that is precisely matched to the opening of the waveguide flange dimension, as discussed above with respect to FIG. 16A.

The top layers 143(3), 143(5) provide a low-loss substrate for the launch transducer elements 200(3), 200(5) which have a top metallization pattern and a bottom metallization pattern. The top metallization pattern of the launch transducer elements 200(3), 200(5) comprises a first pair of transmission line sections 148A and 148B. The first pair of transmission line sections 148A and 148B are implemented over a ground plane on the bottom side of the top dielectric layers 143(3), 143(5). The first pair of transmission line sections 148A and 148B couple energy from the communication device 180 to a second pair of transmission line sections 152A and 152B. The first pair of transmission line sections 148A and 148B are implemented to match the output impedance of the communication device 180 in a balanced configuration.

The second pair of transmission line sections 152A and 152B are located over the extended portions 144(3), 144(5) of the top layers 143(3), 144(5), which provides a clear substrate section (with no ground plane on the bottom side of the low-loss top layers 143(3), 143(5) in this section) and provide energy from the first pair of transmission lines 148A and 148B to a pair of corresponding transducer elements 154A and 154B. The second pair of transmission line sections 152A and 152B are implemented to match the input impedance of the transducer elements 154A and 1544B.

The transducer elements 154A and 154B are configured to provide substantial energy propagation in a direction parallel to the low-loss dielectric top layers 143(3), 143(5) and away from the second pair of transmission line sections 152A and 152B, thereby forming an end-fire propagation pattern into an opening in the waveguide flange opening. The launch transducer elements 200(3), 200(5) have a width dimension, $Y_t$, that is matched to be inserted into the standard waveguide flange opening having the "b" dimension described above with respect to FIG. 16A. Although an exemplary configuration for the launch transducer elements 200(3), 200(5) is illustrated and described, alternative configurations may be formed using other metallization patterns on the top layers 140(3), 140(5). By way of example, in another embodiment, the launch transducer elements 200(3), 200(5) may include a variation of a dipole with a parasitic element as illustrated in FIG. 19.

Referring now more specifically to FIG. 27A, in the wide body configuration of the printed circuit board assembly 140(5), the transducer elements 154A and 154B have a linear configuration that, along with the modifications to the waveguide interface as discussed below, provides improved transmission/reception through the transducer elements 154A and 154B.

Figure 26A:
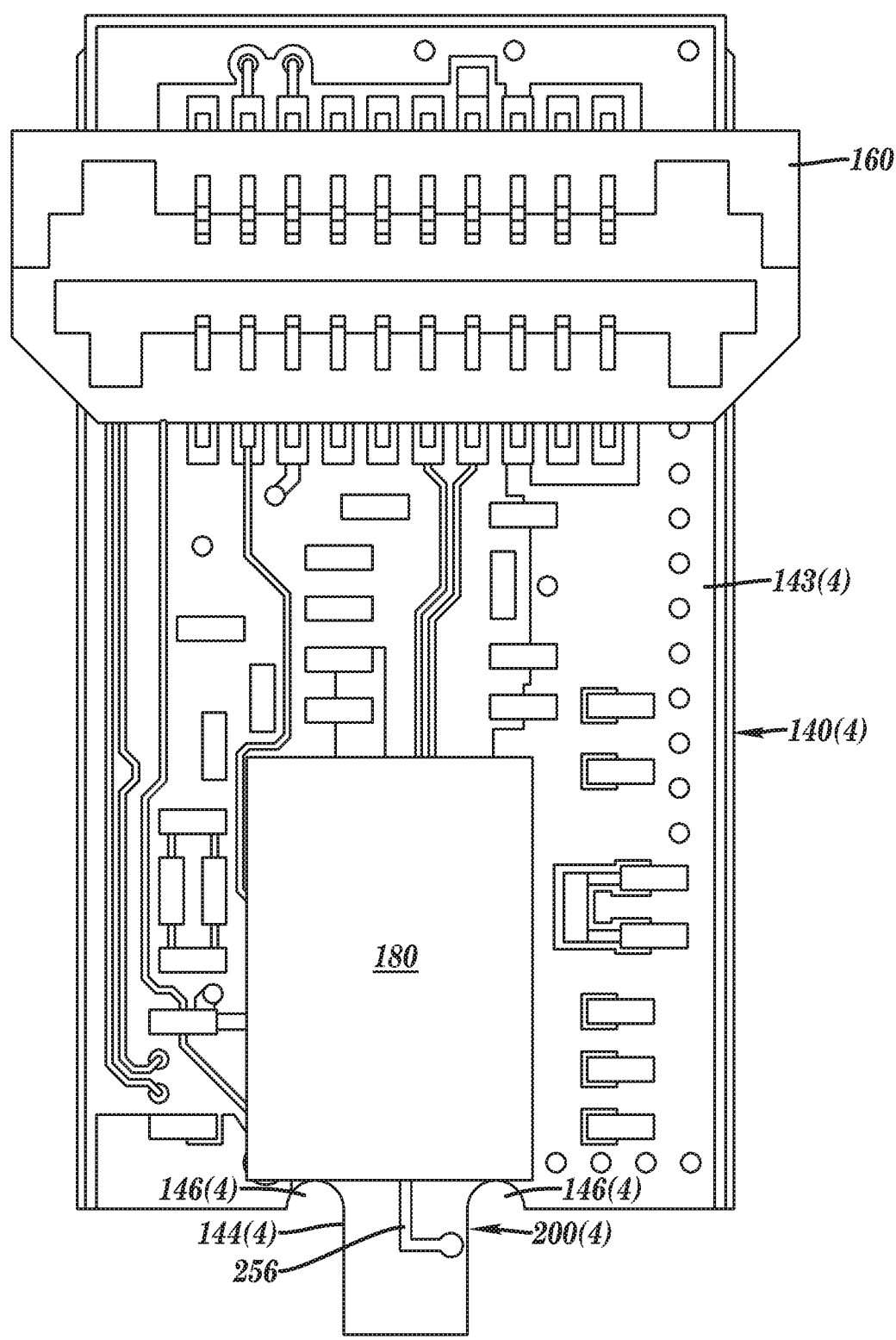
FIGS. 26A and 26B are top and bottom views of an exemplary printed circuit board assembly with an integrated receiver launch transducer and having a narrow body configuration for use with the exemplary waveguide interfaces of the present technology.
Figure 26B:
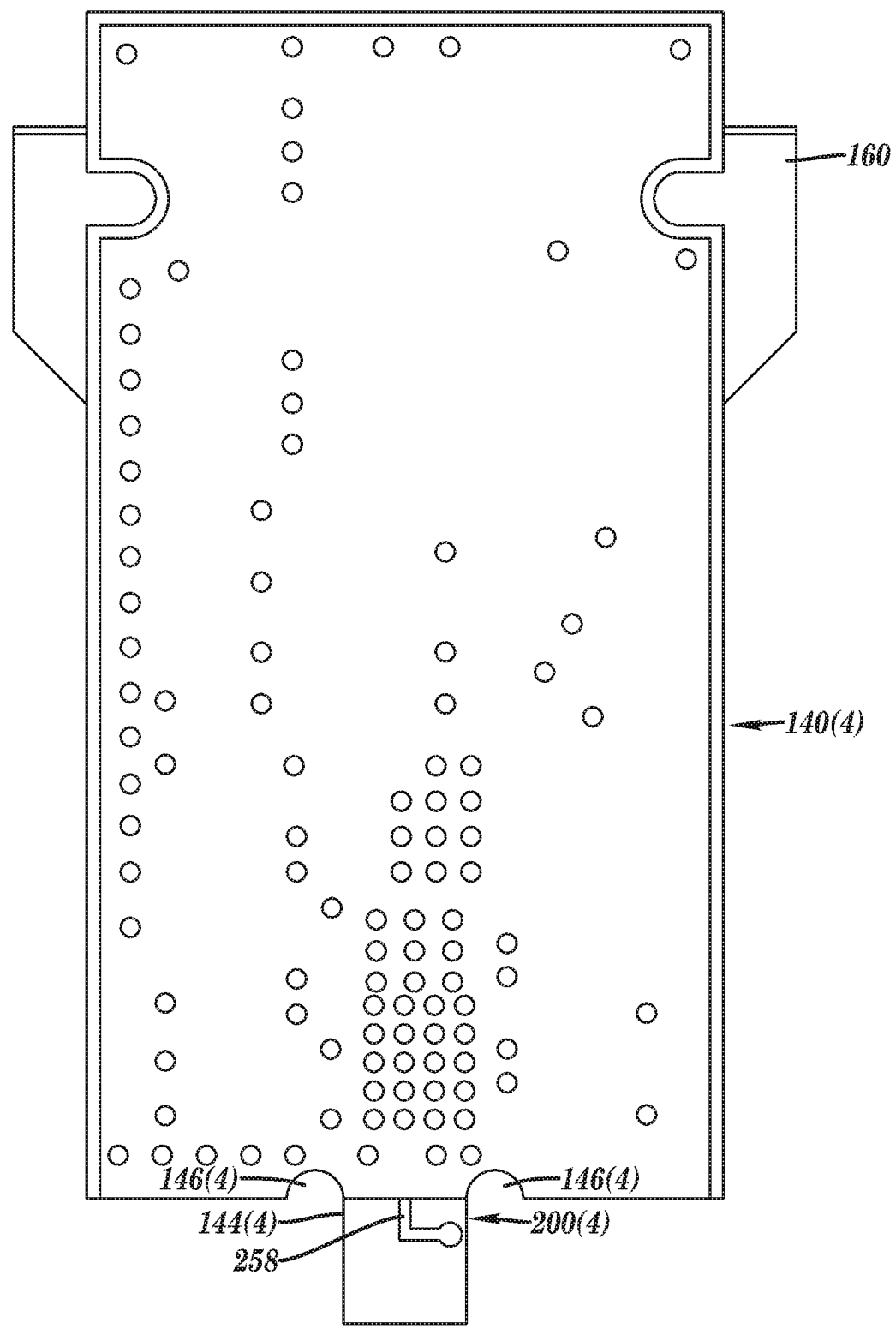
Figure 28A:
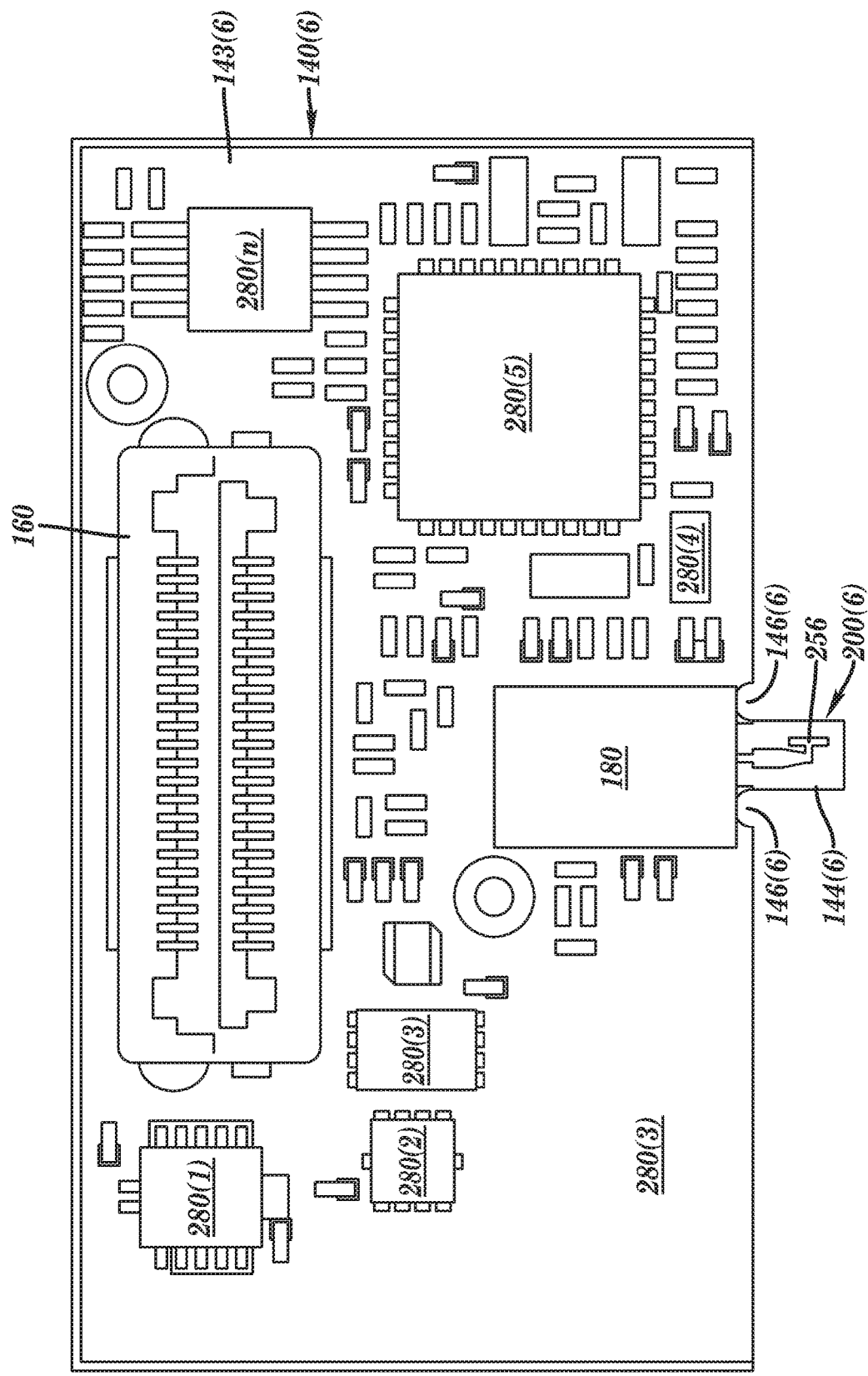
FIGS. 28A and 28B are top and bottom views of an exemplary printed circuit board assembly with an integrated receiver launch transducer and having a wide body configuration for use with the exemplary waveguide interfaces of the present technology.

Referring now more specifically to FIGS. 26A and 28A, in this example the printed circuit board assemblies 140(4), 140(6) include the launch transducer elements 200(4), 200(6), which act as receivers. The launch transducer elements 200(4), 200(6) are formed by printing or etching conductive material, such as copper by way of example, on the low-loss, high frequency dielectric top layers 143(4), 143(6). In this example, the dielectric top layers 143(4), 143(6) are approximately 0.004 inches (4.0 mils) thick and the printed or etched conductive layer is approximately 0.0022 inches (2.2 mils) thick. In one example, the launch transducer elements 200(4), 200(6) are at least 60 GHz millimeter wave launch transducers, although the present technology is not limited thereto.

The launch transducer elements 200(4), 200(6) are implemented with matching unbalanced transmission line terminals to efficiently deliver high-frequency energy to the communication device 180, by way of example only. The launch transducer elements 200(4), 200(6) are located precisely at the midpoint between the width edges of the printed circuit assemblies 140(4), 140(6). The launch transducer elements 200(4), 200(6) have a width that is precisely matched to the opening of the waveguide flange dimension, as discussed above with respect to FIG. 16B.

The top layers 143(4), 143(6) provide a low-loss substrate for the launch transducer elements 200(4), 200(6), which have a top metallization pattern and a bottom metallization pattern. In this example, the top metallization pattern, which is printed or etched onto the top layers 143(4), 143(6) using a conductive material, includes a transmission line center conductor 256 that traverses a length over a ground plane located on the bottom side of the low-loss top layers 143(4), 143(6). Beyond the position of the ground plane, the transmission line center conductor 256 continues and is positioned over a bottom side transmission line 258. The transmission line center conductor 256 and the bottom side transmission line 258 together are coupled to transducer elements that form a dual element dipole that is configured to provide a directional propagation pattern in a direction parallel to the low-loss top layers 143(4), 143(6) of the printed circuit board assemblies 140(4), 140(6) and away from the transmission line center conductor 256 and the bottom side transmission line 258, thereby forming an end-fire propagation pattern into a waveguide flange opening, as discussed below.

The unbalanced input circuit configuration is composed of a ground connection and the transmission line center conductor 256. The ground connection is electrically connected from the communication device 180, which acts as a receiver, through the low-loss top layers 143(4), 143(6) and facilitated by metalized plating through holes (also known as vias), thereby forming a low-inductance connection to the ground plane on the bottom side of the low-loss top layers 143(4), 143(6).

Figure 28B:
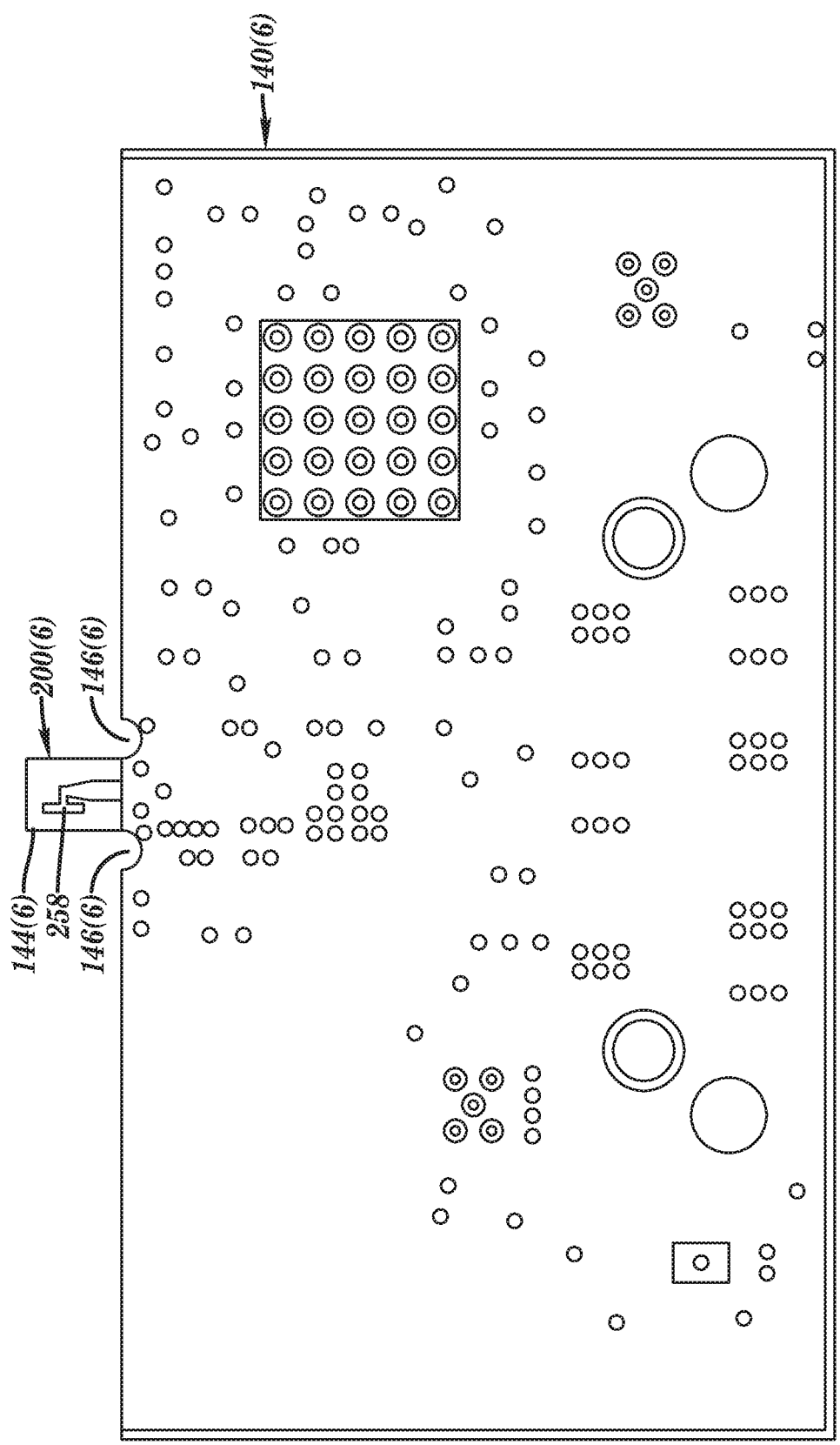

Referring now more specifically to FIGS. 28A and 28B, in the wide body configuration of the printed circuit board assembly 140(6), the transmission line center conductor 256 and the bottom side transmission line 258 have a linear configuration that, along with the modifications to the waveguide interface as discussed below, provides improved transmission/reception through the transducer elements 154A and 154B.

Referring now to FIGS. 25A, 26A, 27A, and 28A, the communication device 180 can be surface mounted directly on the printed circuit board assemblies 140(3)-140(6). The communication device 180 is configured to act as a transmitter with the printed circuit board assemblies 140(3) and 140(5) and as a receiver with printed circuit board assemblies 140(4) and 140(6). The communication device 180 is surface mounted on the printed circuit board assemblies 140(3)-140(6) adjacent the launch transducer elements 200(3)-200(6). Connections to the communication device 180 are provided based on the metallization pattern located on the printed circuit board assemblies 140(3)-140(6). In the example illustrated in FIGS. 27A-28B having the wide body configuration, additional communications 280(1)-280(n) may be advantageously employed on other locations of the printed circuit board assemblies 140(5) and 140(6), as shown in FIGS. 27A and 28A.

Referring again to FIG. 25A-28B, in this example the communication device 180 and the additional communications devices 280(1)-280(n) are highly integrated millimeter wave radio transmitters/receivers that are surface mounted to the printed circuit board assemblies 140(3)-140(6) using wafer level chip scale packaging techniques, although a highly integrated millimeter wave radio receiver may be used in other examples. In one example, the communication device 180 and the additional communications devices 280(1)-280(n) contain silicon germanium (SiGe) chips, although gallium arsenide (GaAs), complementary metal oxide semiconductors (CMOS), or other semiconductor chips may be utilized for the communication devices. The communication device 180 or the additional communication devices 280(1)-280(n), by way of example only, may be configured to work with a 60 GHz millimeter wave launch transducer elements 200(3)-200(6).

The printed circuit board assemblies 140(3)140(6) further include a connector 160 that is a multi-pin connector that provides the lower-frequency electrical signals and power connections to the communication device 180 or the additional communication devices 280(1)-280(n), although other types of connectors suitable to provide the lower-frequency electrical signals and power connections to the communication devices may be utilized. The connector 160 is located on the printed circuit assemblies 140(3)-140(6) and is located at the rear of the waveguide interface when assembled, as shown in FIGS. 25A, 26A, 27A, and 28A. The connector 160 is coupled to the printed circuit board assemblies 140(3)-140(6) through the metallization pattern formed on the dielectric top layers 143(3)-143(6).

Referring now to FIGS. 29A-29E, the printed circuit board assembly 140(3) having a narrow body configuration is illustrated coupled to the waveguide interface 12(1) as described above, although the printed circuit board assembly 140(3) may be utilized with any of the examples of the waveguide interfaces 12(1) and 12(2) of the waveguide assembly 10 as described above. Although printed circuit board assembly 140(3) is described, the printed circuit board assembly 140(4), which also has a narrow body configuration, could be utilized with the waveguide interface 12(1) or 12(2) in the same manner.

Figure 29A:
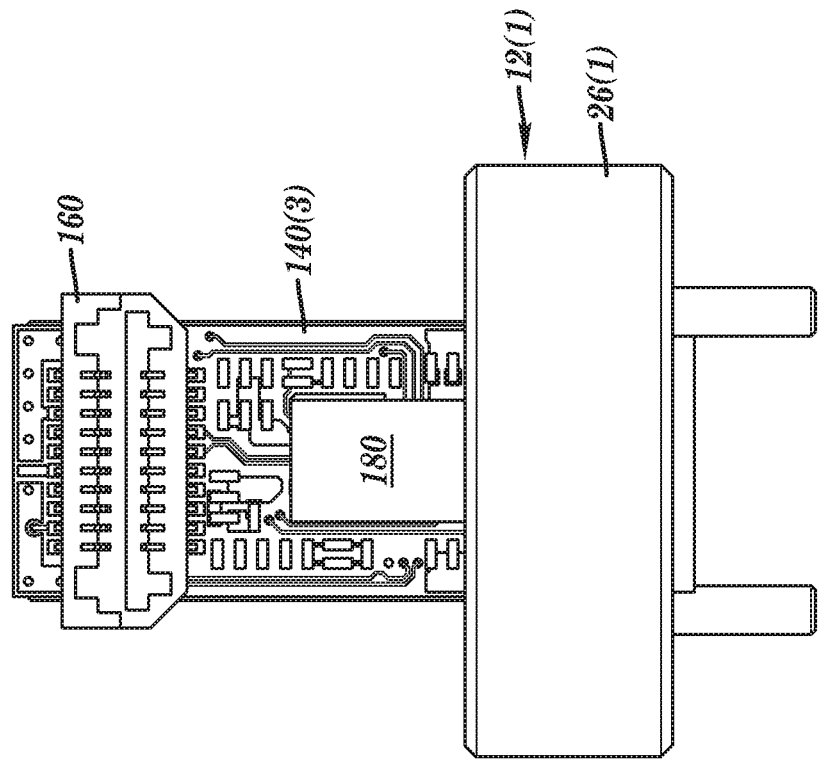
Figure 29B:
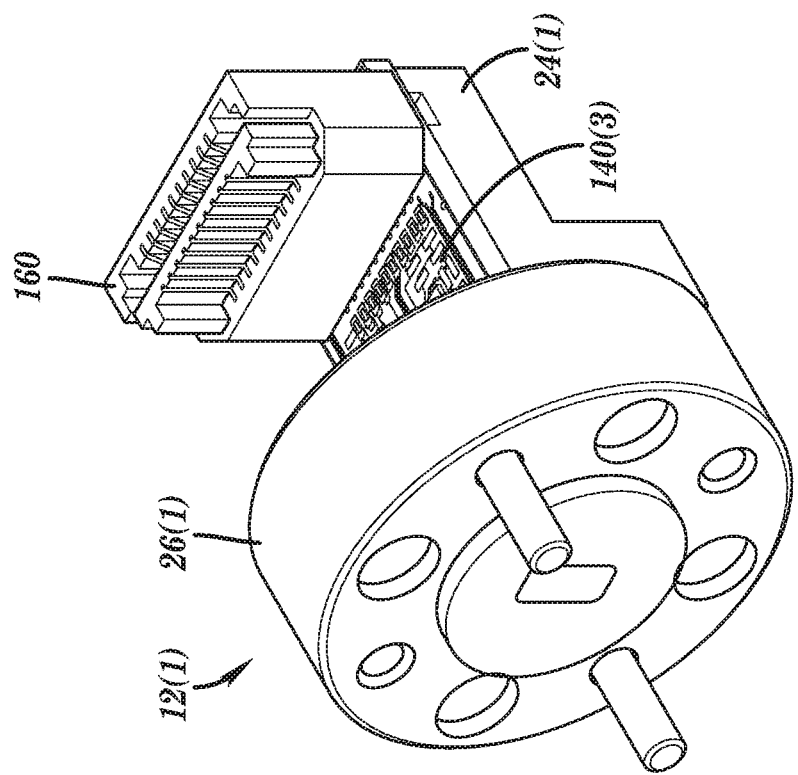

Referring again to FIGS. 29A-29E, the printed circuit board assembly 140(3) is positioned on the support block 24(1) of the waveguide interface 12(1). The printed circuit board assembly 140(3) is positioned such that the printed circuit board assembly 140(3) and the transducer element 200(3) extend into the rectangular slot 34(1) located through the interface plate 26(1), as shown in FIGS. 29C-29E. The length of the rectangular slot 34(1) is configured to accept the printed circuit board assembly 140(3) and the launch transducer element 200(3). The printed circuit board assembly 140(3) and the rectangular slot 34(1) form a short waveguide segment 36 within the rectangular slot 34(1) when coupled to the waveguide interface 12(1). The waveguide segment 36 generates a high waveguide cutoff frequency so that no waveguide modes exist in the waveguide segment 36. As a result, energy flows to the transducer element 200(3), which is located in the full opening of the rectangular slot 34(1) where transduction from electrical to electromagnetic energy takes place, with minimal loss.

Referring now to FIGS. 30A-30F, the printed circuit board assembly 140(5) having a wide body configuration is illustrated coupled to a waveguide interface 12(3). The waveguide interface 12(3) includes a support block 24(3)

coupled to a waveguide flange 26(3), although the waveguide interface 12(3) may include other elements in other configurations. The waveguide interface 12(3) is the same in structure and operation as the waveguide interfaces 12(1) and 12(2) except as described below. The waveguide interface 12(3) may be formed in the manner discussed with respect to either the waveguide interface 12(1), or molded as a single monolithic structure as discussed with the respect to the waveguide interface 12(2), although other methods of forming the waveguide interface 12(3) may be employed. Although printed circuit board assembly 140(5) is described, the printed circuit board assembly 140(6), which also has a narrow body configuration, could be utilized with the waveguide interface 12(3) in the same manner.

Figure 30B:
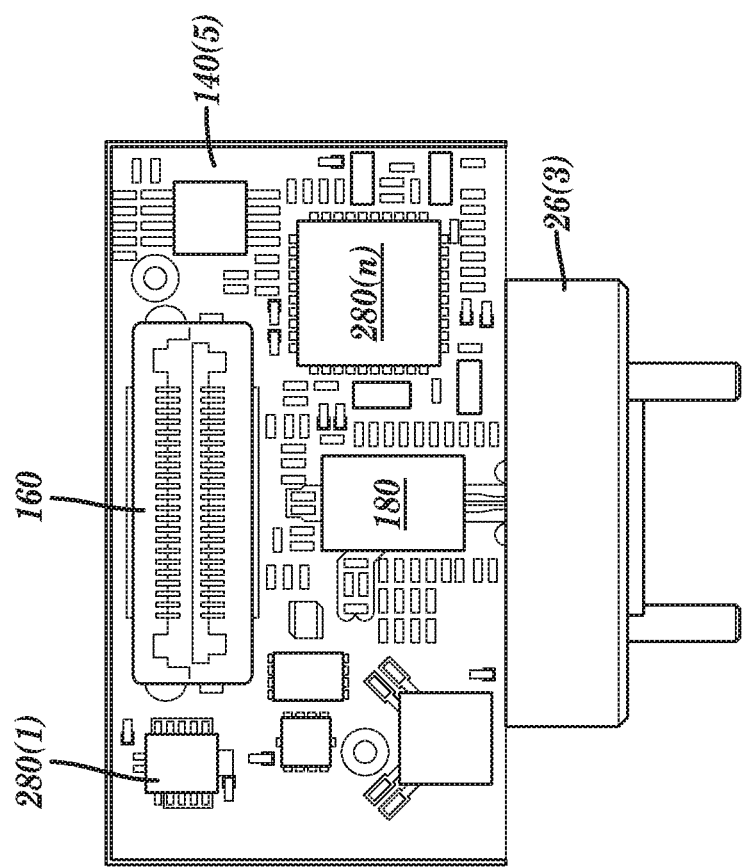
Figure 30A:
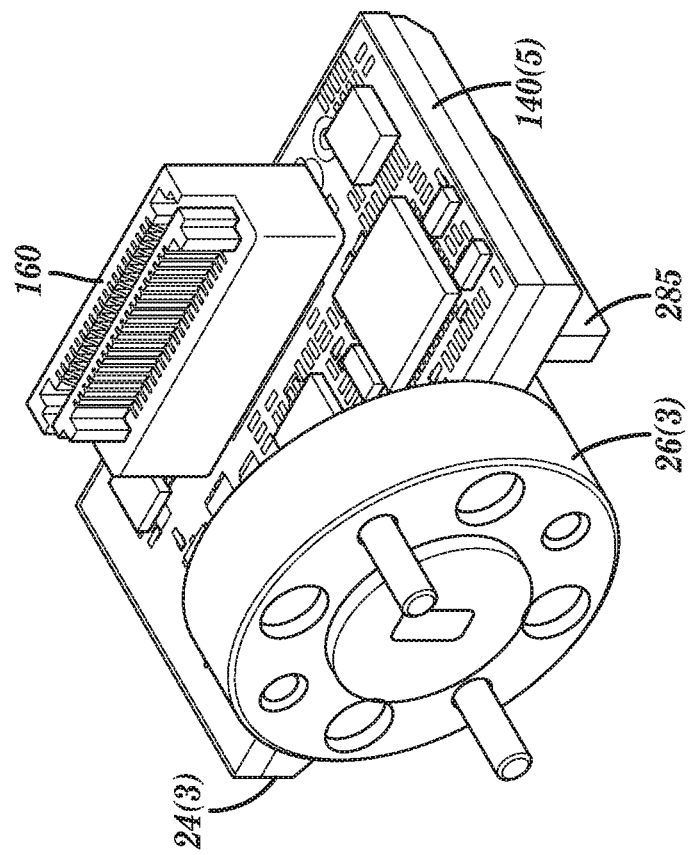
Figure 30F:
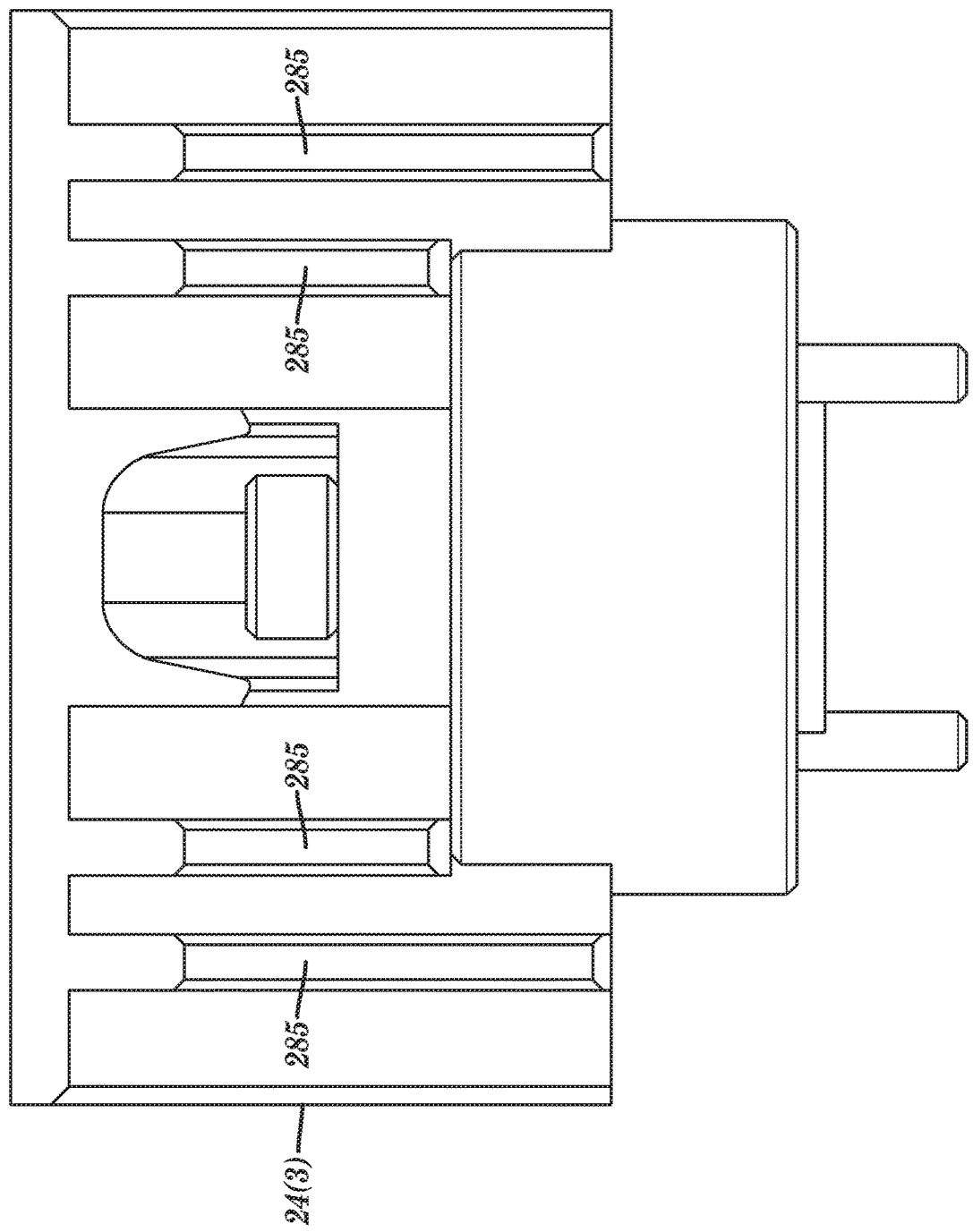
FIG. 30F is a bottom view of the waveguide interface shown in FIGS. 30A-30E.

Referring now more specifically to FIGS. 30A-30E, the printed circuit board assembly 140(5) is positioned on the support block 24(3) of the waveguide interface 12(3). The support block 24(3) is wider in the direction perpendicular to the extension of the launch transducer element 200(5) to accommodate the extended width of the printed circuit board assembly 140(5). In this manner, the printed circuit board assembly 140(5) can accommodate additional communication devices 280(1)-280(n) in addition to the communication device 180. As shown in FIG. 30F, the bottom portion of the support block 24(3) has ridges 285 to provide a more efficient heat sink in order to accommodate the heat generated by additional devices.

The printed circuit board assembly 140(5) is positioned such that the transducer element 200(5) extends into the rectangular slot 34(3) located through the interface plate waveguide flange 26(3), as shown in FIGS. 30C-30E. The length of the rectangular slot 34(3) is configured to accept the launch transducer element 200(5). In this example, as shown in FIG. 30E, the interface plate 24(3) includes an aperture 300 located in the back wall thereof that forms the waveguide segment 36. The aperture 300 eliminates the overhang from the wall of the interface plate 26(3) and provides a higher waveguide cutoff that prevents the radiation from being directed in other directions. The aperture 300 provides a higher efficiency of energy flow to the transducer element 200(5).

Referring again to FIGS. 1A-4, the waveguide interface 12(1) is coupled to the waveguide flange 22. The waveguide flange 22 is a standard waveguide flange known in the art. As shown in FIG. 2A, the waveguide flange 22 includes a waveguide flange opening 90 that may be aligned with the rectangular slot 34(1) in the interface plate 26(1) of the waveguide interface 12(1). FIG. 5C illustrates the waveguide flange 22 coupled to the interface plate 26(1), wherein the interface plate 26(1) is aligned to the waveguide flange assembly 22 with the rectangular slot 34(1) of the interface plate 26(1) overlapping with the waveguide flange opening 90.

As shown in FIG. 5A, the waveguide flange 22 includes the waveguide opening 90 positioned substantially in the center of the circular waveguide flange 22. In particular, the waveguide opening 90 is rectangular having an "a" dimension representing the H-field and a "b" dimension representing the E-field for a rectangular waveguide. In this example, the dimensions of the waveguide opening 90 are configured to be utilized for the frequency range of 50 to 75 GHz, whereby the dimensions are defined by what is known categorized in the art as WR-15 or in military standard MIL-DTL-85/3C as M85/3-018. By way of example only, for the 50 to 75 GHz standard waveguide frequency range, also known as V-band, the "a" dimension is approximately 3.76 mm and the "b" dimension is approximately 1.88 mm, although other "a" and "b" dimensions may be utilized depending on the type of application and/or the frequency range desired. Precise alignment of interface plate 26(1) with the standard waveguide flange 22 is facilitated by the standard waveguide flange guide pins 92 inserted into guide pin holes 41(1) contained within interface plate 26(1), as discussed above.

An example of the operation of the waveguide assembly 10, including either waveguide interface 12(1) or waveguide interface 12(2) will now be described with respect to FIGS. 1A-18B. It should be noted that the detailed description of the transmitter waveguide interface operation applies equally to the receiver waveguide interface with the direction of the millimeter wave transduction and energy reversed. Those of ordinary skill in the art will realize that both the transmission context and the reception context equally apply due to the Lorentz electromagnetic reciprocity theorem. It is also noted that although the operation is discussed with respect to waveguide interface 12(1), the operation of waveguide interface 12(2) is substantially the same as waveguide interface 12(1). Either waveguide interface 12(1) or 12(2) may further be utilized with the printed circuit board assemblies 140(1) and 140(2) as shown in FIGS. 20-24C.

Critical to the high efficiency and operation of the waveguide interfaces 12(1) and 12(2) is to facilitate propagation of millimeter wave energy into standard waveguide flange opening 90 and also restrict energy losses as the conducted electrical energy moves from the communications device 18(1) through the high frequency wire bonds 60(1) to the first pair of transmission lines 68A and 68B. The short waveguide segment 36 is defined between the rectangular slot 34(1) of interface plate 26(1), or interface 26(2), and the upper ground plane surface 48 of the printed circuit board assembly 14. The printed circuit board assembly 14 also has contiguous copper plating at side ground plane area 50 and front ground plane area 52, which form the lower portion of the short waveguide segment 36.

The waveguide cutoff frequency is the frequency at which all frequencies below the cutoff frequency are substantially attenuated. Equation [1], derived from the Helmholtz equation for electromagnetic waves, provides the waveguide cutoff frequency for rectangular waveguide with an internal H-field "a" dimension and internal E-field "b" dimension.

$$\omega_c = c\sqrt{\left(\frac{n\pi}{a}\right)^2 + \left(\frac{m\pi}{b}\right)^2} \quad [1]$$

In equation [1], $\omega_c$ is radian frequency, c is the speed of light, a is the H-field rectangular waveguide dimension, b is the E-field rectangular waveguide dimension, and n and m represent the waveguide mode numbers. The dominant waveguide mode is used to determine waveguide cutoff and is known in the art as transverse electric mode 1,0 ($TE_{1,0}$) where n=1 and m=0. With n=1 and m=0, the only variable remaining is the waveguide H-field "a" dimension.

In one example, for the standard waveguide flange 22, the "a" dimension is 3.76 mm which yields a cutoff frequency of 39.9 GHz, well below the intended operating frequency range of standard waveguide flange 22, which is 50 to 75 GHz. However, it is desired to substantially attenuate the transduction of energy over the operating frequency range of the waveguide interface in the short waveguide segment 36.

The H-field dimension of short waveguide segment 36 is shown as the "a'" dimension. In one example, the "a'"

dimension is approximately 0.98 mm (980 μm). Setting a in equation [1] to 0.98 mm with dominant mode (n=1 and m=0) yields a cutoff frequency of 153 GHz, well above the intended operating range of the waveguide interface. There will be slight variations of the cutoff frequency as the dimension "a'" varies as a function of the thickness of the printed circuit board assembly 14 and the effective dimension "a'" varies due to the dielectric loading properties and thickness variation of launch transducer 20(1). However, with all variations taken into account, the minimum waveguide cutoff frequency for either the transmitter waveguide interface or the receiver waveguide interface is greater than 120 GHz. By establishing short segment waveguide 36 cutoff frequency well above the operating frequency range of the waveguide interface, maximum energy is provided to the standard waveguide opening 90.

Accordingly, this exemplary technology provides a number of advantages including providing a waveguide assembly including a waveguide interface that may be utilized at high operating frequencies. The waveguide assembly of the present technology incorporates, in one example, a printed circuit board assembly that includes an integrated launch transducer element that can interact with integrated circuits applied to the printed circuit board assembly using surface mount technologies. This avoids costly wire bonding between the printed circuit board assembly and the integrated circuit employed.

Having thus described the basic concept of the disclosed technology, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the disclosed technology. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. A printed circuit board comprising:
   a plurality of laminated layers each extending between a first end and a second end of the printed circuit board, at least one of the plurality of laminated layers formed of a dielectric material and having an extended portion extending beyond the ends of the other layers in the plurality of laminated layers at the second end of the printed circuit board; and
   a first metallic layer located on at least a portion of the extended portion of the at least one of the plurality of laminated layers, the first metallic layer and the at least one of the plurality of laminated layers configured to form a launch transducer comprising one or more transmission lines and a transducer element coupled to the one or more transmission lines, wherein the transducer element is configured to propagate millimeter wave frequency signals.

2. The printed circuit board of claim 1, wherein the extended portion is configured to be inserted into a slot in a waveguide interface coupled to a support block when the printed circuit board is positioned on the support block.

3. The printed circuit board of claim 2, wherein the transducer element is configured to be located in the slot in the waveguide interface when the printed circuit board is positioned on the support block.

4. The printed circuit board of claim 2, wherein the launch transducer has an operating frequency of at least 50 GHz.

5. The printed circuit board of claim 1, wherein the at least one of the plurality of laminated layers is formed of a low-loss high frequency dielectric material.

6. The printed circuit board of claim 1 further comprising:
   a second metallic layer located on the at least a portion of the extended portion of the at least one of the plurality of laminated layers opposite the first metallic layer, wherein the first metallic layer, the at least one of the plurality of laminated layers, and the second metallic layer are configured to form the launch transducer.

7. The printed circuit board of claim 1, wherein the plurality of laminated layers have a first dimension perpendicular to the extended portion that is greater than a second dimension parallel to the extended portion.

8. The printed circuit board of claim 1, wherein the plurality of laminated layers have a cutout portion from the second end on two sides of the extended portion.

9. A waveguide assembly comprising:
   a support block and a waveguide interface coupled to an end portion of the support block and extending from the support block, the waveguide interface having a slot and one or more holes positioned to receive attachment devices to secure the waveguide interface to a waveguide flange; and
   a printed circuit board comprising:
      a plurality of laminated layers each extending between a first end and a second end of the printed circuit board, at least one of the plurality of laminated layers formed of a dielectric material and having an extended portion extending beyond the ends of the other layers in the plurality of laminated layers at the second end of the printed circuit board, wherein the extended portion is configured to be inserted into the slot in the waveguide interface when the printed circuit board assembly is positioned on the support block; and
      a first metallic layer located on at least a portion of the extended portion of the at least one of the plurality of laminated layers the first metallic layer and the at least one of the plurality of laminated layers configured to form a launch transducer comprising one or more transmission lines and a transducer element coupled to the one or more transmission lines, wherein the transducer element is configured to propagate millimeter wave frequency signals and is configured to be located in the slot in the waveguide interface when the printed circuit board is positioned on the support block.

10. The waveguide assembly of claim 9, further comprising:
    a communication device coupled to the printed circuit board, wherein the launch transducer is positioned adjacent to and coupled to the communication device; and
    the waveguide flange coupled to the waveguide interface, the waveguide flange having a waveguide opening.

11. The waveguide assembly of claim 10, wherein the communication device is configured to transmit and receive the millimeter wave signals.

12. The waveguide assembly of claim 10, wherein the waveguide interface is positioned flush against the waveguide flange such that a narrow dimension of the slot within the waveguide interface is orthogonal to an H-field dimension of the waveguide flange.

13. The waveguide assembly of claim 10, wherein the transducer element of the launch transducer is positioned within the slot within the waveguide interface such that the slot prevents energy from the one or more transmission lines from being emitted toward the printed circuit board or the waveguide opening and allows energy to pass from the transducer element into the waveguide opening.

14. The waveguide assembly of claim 9, wherein the launch transducer is positioned to provide maximum energy propagation along a central axis of the waveguide interface.

15. The waveguide assembly of claim 9, wherein the launch transducer has an operating frequency of at least 50 GHz.

16. The waveguide assembly of claim 9, wherein the at least one of the plurality of laminated layers is formed of a low-loss high frequency dielectric material.

17. The waveguide assembly of claim 9 further comprising:
a second metallic layer located on the at least a portion of the extended portion of the at least one of the plurality of laminated layers opposite the first metallic layer, wherein the first metallic layer, the at least one of the plurality of laminated layers, and the second metallic layer are configured to form the launch transducer.

18. The waveguide assembly of claim 9, wherein the plurality of laminated layers have a first dimension perpendicular to the extended portion that is greater than a second dimension parallel to the extended portion.

19. The waveguide assembly of claim 9, wherein the waveguide interface has an aperture located in a wall of the waveguide interface located opposite the coupling to the support block proximate the slot configured to provide a waveguide section.

20. The waveguide assembly of claim 9, wherein the launch transducer is positioned near a top surface of the support block midway between opposing edges of the top surface of the support block.

21. The waveguide assembly of claim 9, wherein the plurality of laminated layers have a cutout portion from the second end on two sides of the extended portion.

* * * * *